United States Patent [19]

Sakata

[11] Patent Number: 4,998,281

[45] Date of Patent: Mar. 5, 1991

[54] EFFECT ADDITION APPARATUS

[75] Inventor: Goro Sakata, Mitaka, Japan

[73] Assignee: Casio Computer Co., Ltd., Tokyo, Japan

[21] Appl. No.: 504,021

[22] Filed: Apr. 3, 1990

Related U.S. Application Data

[63] Continuation of Ser. No. 233,325, Aug. 17, 1988, abandoned.

[30] Foreign Application Priority Data

| | | | |
|---|---|---|---|
| Aug. 20, 1987 | [JP] | Japan | 62-207197 |
| Sep. 9, 1987 | [JP] | Japan | 62-225595 |
| Sep. 9, 1987 | [JP] | Japan | 62-225597 |
| Sep. 18, 1987 | [JP] | Japan | 62-234000 |
| Oct. 7, 1987 | [JP] | Japan | 62-253234 |

[51] Int. Cl.[5] .......... H03G 3/00

[52] U.S. Cl. .......... 381/63; 84/630

[58] Field of Search .......... 84/622, 626, 628, 629, 84/630, 631, 659, 662, 707; 381/61, 62, 63

[56] References Cited

U.S. PATENT DOCUMENTS

| | | | |
|---|---|---|---|
| 4,373,416 | 2/1983 | Endo et al. | 84/1.26 |
| 4,472,993 | 9/1984 | Futamase et al. . | |
| 4,478,124 | 10/1984 | Kikumoto | 84/1.22 |
| 4,569,268 | 2/1986 | Futamase et al. | 381/63 |
| 4,570,523 | 2/1986 | Futamase et al. . | |
| 4,586,417 | 5/1986 | Kato et al. . | |
| 4,611,300 | 9/1986 | Taylor, Jr. et al. | 381/63 |
| 4,628,789 | 12/1986 | Fujimori | 381/62 |
| 4,649,564 | 3/1987 | Barnett | 381/63 |
| 4,719,833 | 1/1988 | Katoh et al. | 84/1.28 |
| 4,803,731 | 2/1989 | Niimi et al. | 381/63 |
| 4,843,938 | 7/1989 | Hideo | 84/622 |

OTHER PUBLICATIONS

Snell, "Design of a Digital Oscillator Which Will Generate Up to 256 Low Distortion Sine Waves in Real Time", Computer Music Journal, Apr. 1977, pp. 4–29.

*Primary Examiner*—Forester W. Isen

*Attorney, Agent, or Firm*—Frishauf, Holtz, Goodman & Woodward

[57] ABSTRACT

Each time sampling clock CK is input, a controller controls respective circuits, and performs various arithmetic operations of data stored in tone color parameter memories, and time-divisionally performs sound effect addition and changing of tone color parameters.

11 Claims, 34 Drawing Sheets

| ADDRESS | NAME | CONTENT (FUNCTION) |
|---|---|---|
| 0 | RD 1 | OUTPUT FROM FIRST DELAY CIRCUIT BEFORE 1 SAMPLING PERIOD |
| 1 | RD 2 | OUTPUT FROM SECOND DELAY CIRCUIT BEFORE 1 SAMPLING PERIOD |
| 2 | RD 3 | OUTPUT FROM THIRD DELAY CIRCUIT BEFORE 1 SAMPLING PERIOD |
| 3 | RD 4 | OUTPUT FROM FOURTH DELAY CIRCUIT BEFORE 1 SAMPLING PERIOD |
| 4 | DW | CAPACITY OF WAVEFORM DATA MEMORY USED BY ONE DELAY CIRCUIT (FFFh) |
| 5 | DS 1 | START ADDRESS OF WAVEFORM DATA MEMORY USED BY FIRST DELAY CIRCUIT (0000h) |
| 6 | DS 2 | START ADDRESS OF WAVEFORM DATA MEMORY USED BY SECOND DELAY CIRCUIT (1000h) |
| 7 | DS 3 | START ADDRESS OF WAVEFORM DATA MEMORY USED BY THIRD DELAY CIRCUIT (2000h) |
| 8 | DS 4 | START ADDRESS OF WAVEFORM DATA MEMORY USED BY FOURTH DELAY CIRCUIT (3000h) |
| 9 | ZERO | CONSTANT 0 |
| 10 | ONE | CONSTANT 0001h |
| 11 | MC | COUNTER INDICATING OPERATION STATE UPON CHANGING OF PARAMETER |
| 12 | CRC | ADDRESS COUNTER USED UPON CLEARING OF WAVEFORM DATA MEMORY |
| 13 | CRI | END ADDRESS OF WAVEFORM DATA MEMORY USED |
| 14 | WAVE | STORE INPUT SIGNAL DATA x VOLI |

FIG. 4(a)

| | ADDRESS | NAME | CONTENT (FUNCTION) |
|---|---|---|---|
| TONE COLOR PARAMETER | 0 | $g_1$ | FEEDBACK MULTIPLICATOR OF FIRST DELAY CIRCUIT |
| | 1 | $g_2$ | FEEDBACK MULTIPLICATOR OF SECOND DELAY CIRCUIT |
| | 2 | $g_3$ | FEEDBACK MULTIPLICATOR OF THIRD DELAY CIRCUIT |
| | 3 | $g_4$ | FEEDBACK MULTIPLICATOR OF FOURTH DELAY CIRCUIT |
| | 4 | $t_1$ | DELAY TIME OF FIRST DELAY CIRCUIT |
| | 5 | $t_2$ | DELAY TIME OF SECOND DELAY CIRCUIT |
| | 6 | $t_3$ | DELAY TIME OF THIRD DELAY CIRCUIT |
| | 7 | $t_4$ | DELAY TIME OF FOURTH DELAY CIRCUIT |
| | 8 | VOLI | INPUT TONE VOLUME |
| | 9 | VOLO | OUTPUT TONE VOLUME |
| | 10 | AD 1 | WRITE ADDRESS COUNTER OF FIRST DELAY CIRCUIT TO WAVEFORM DATA MEMORY |
| | 11 | AD 2 | WRITE ADDRESS COUNTER OF SECOND DELAY CIRCUIT TO WAVEFORM DATA MEMORY |
| | 12 | AD 3 | WRITE ADDRESS COUNTER OF THIRD DELAY CIRCUIT TO WAVEFORM DATA MEMORY |
| | 13 | AD 4 | WRITE ADDRESS COUNTER OF FOURTH DELAY CIRCUIT TO WAVEFORM DATA MEMORY |
| | 14 | SEA | STORE ADDRESS (8 OR 9) OF VOLO WHEN VOLI AND VOLO ARE GRADUALLY CHANGED |
| | 15 | SED | STORE TARGET VALUE TO ATTAIN WHEN VOLI AND VOLO ARE GRADUALLY CHANGED |
| | 16 | SEC | COUNTER FOR COUNTING CHANGE TIME WHEN VOLI AND VOLO ARE GRADUALLY CHANGED |
| | 17 | SEI | INITIAL VALUE USED WHEN VOLI AND VOLO ARE GRADUALLY CHANGED |
| | 18 | SEG | MULTIPLICATOR DETERMINING RATE OF CHANGE WHEN VOLI AND VOLO ARE GRADUALLY CHANGED |

FIG. 4(b)

| ADDRESS | NAME | CONTENT (FUNCTION) |
|---|---|---|
| 0 | RD 1 | OUTPUT FROM FIRST DELAY CIRCUIT BEFORE 1 SAMPLING PERIOD |
| 1 | RD 2 | OUTPUT FROM SECOND DELAY CIRCUIT BEFORE 1 SAMPLING PERIOD |
| 2 | RD 3 | OUTPUT FROM THIRD DELAY CIRCUIT BEFORE 1 SAMPLING PERIOD |
| 3 | RD 4 | OUTPUT FROM FOURTH DELAY CIRCUIT BEFORE 1 SAMPLING PERIOD |
| 4 | DW | CAPACITY OF WAVEFORM DATA MEMORY USED BY ONE DELAY CIRCUIT (FFFh) |
| 5 | DS 1 | START ADDRESS OF WAVEFORM DATA MEMORY USED BY FIRST DELAY CIRCUIT (0000h) |
| 6 | DS 2 | START ADDRESS OF WAVEFORM DATA MEMORY USED BY SECOND DELAY CIRCUIT (1000h) |
| 7 | DS 3 | START ADDRESS OF WAVEFORM DATA MEMORY USED BY THIRD DELAY CIRCUIT (2000h) |
| 8 | DS 4 | START ADDRESS OF WAVEFORM DATA MEMORY USED BY FOURTH DELAY CIRCUIT (3000h) |
| 9 | ZERO | CONSTANT 0 |
| 10 | ONE | CONSTANT 0001h |
| 11 | MC | COUNTER INDICATING OPERATION STATE UPON CHANGING OF PARAMETER |
| 12 | WAVE | STORE INPUT SIGNAL DATA x VOLI |

FIG.12(a)

| | ADDRESS | NAME | CONTENT (FUNCTION) |
|---|---|---|---|
| TONE COLOR PARAMETER | 0 | $g_1$ | FEEDBACK MULTIPLICATOR OF FIRST DELAY CIRCUIT |
| | 1 | $g_2$ | FEEDBACK MULTIPLICATOR OF SECOND DELAY CIRCUIT |
| | 2 | $g_3$ | FEEDBACK MULTIPLICATOR OF THIRD DELAY CIRCUIT |
| | 3 | $g_4$ | FEEDBACK MULTIPLICATOR OF FOURTH DELAY CIRCUIT |
| | 4 | $t_1$ | DELAY TIME OF FIRST DELAY CIRCUIT |
| | 5 | $t_2$ | DELAY TIME OF SECOND DELAY CIRCUIT |
| | 6 | $t_3$ | DELAY TIME OF THIRD DELAY CIRCUIT |
| | 7 | $t_4$ | DELAY TIME OF FOURTH DELAY CIRCUIT |
| | 8 | VOLI | INPUT TONE VOLUME |
| | 9 | VOLO | OUTPUT TONE VOLUME |
| | 10 | AD 1 | WRITE ADDRESS COUNTER OF FIRST DELAY CIRCUIT TO WAVEFORM DATA MEMORY |
| | 11 | AD 2 | WRITE ADDRESS COUNTER OF SECOND DELAY CIRCUIT TO WAVEFORM DATA MEMORY |
| | 12 | AD 3 | WRITE ADDRESS COUNTER OF THIRD DELAY CIRCUIT TO WAVEFORM DATA MEMORY |
| | 13 | AD 4 | WRITE ADDRESS COUNTER OF FOURTH DELAY CIRCUIT TO WAVEFORM DATA MEMORY |
| | 14 | SEA | STORE ADDRESS (0 ~ 7) OF TONE COLOR PARAMETER WHEN TONE COLOR PARAMETER ARE GRADUALLY CHANGED |
| | 15 | SED | STORE TARGET VALUE TO ATTAIN WHEN TONE COLOR PARAMETER ARE GRADUALLY CHANGED |
| | 16 | SEC | COUNTER FOR COUNTING CHANGE TIME WHEN TONE COLOR PARAMETER ARE GRADUALLY CHANGED |
| | 17 | SEI | INITIAL VALUE USED WHEN TONE COLOR PARAMETER ARE GRADUALLY CHANGED |
| | 18 | SEG | MULTIPLICATOR DETERMINING RATE OF CHANGE WHEN TONE COLOR PARAMETER ARE GRADUALLY CHANGED |

FIG.12(b)

| ADDRESS | NAME | CONTENT |
|---|---|---|
| 0 ~ 3n | | AREA FOR LFO |
| 3n + 1 | DPOINTR | INPUT POINTER OF RIGHT-CHANNEL DELAY EFFECT MEMORY |
| 3n + 2 | DPOINTL | INPUT POINTER OF LEFT-CHANNEL DELAY EFFECT MEMORY |
| 3n + 3 | DERIAAR | AREA SIZE OF RIGHT-CHANNEL DELAY EFFECT MEMORY |
| 3n + 4 | DERIAAL | AREA SIZE OF LEFT-CHANNEL DELAY EFFECT MEMORY |
| 3n + 5 | DERIAOR | START ADDRESS OF AREA OF RIGHT-CHANNEL DELAY EFFECT MEMORY |
| 3n + 6 | DERIAOL | START ADDRESS OF AREA OF LEFT-CHANNEL DELAY EFFECT MEMORY |
| 3n + 7 | CPOINT | INPUT MEMORY OF CHORUS EFFECT MEMORY |
| 3n + 8 | CERIAA | AREA SIZE OF CHORUS EFFECT MEMORY |
| 3n + 9 | CERIAO | START ADDRESS OF CHORUS EFFECT MEMORY |
| 3n + 10 | RPOINT | INPUT POINTER OF REVERBATION EFFECT MEMORY |
| 3n + 11 | RERIAA | AREA SIZE OF REVERBATION EFFECT MEMORY |
| 3n + 12 | RERIAO | START ADDRESS OF REVERBATION EFFECT MEMORY |
| 3n + 13 | DRDATAR | FEEDBACK WAVEFORM DATA FOR RIGHT-CHANNEL DELAY |
| 3n + 14 | DRDATAL | FEEDBACK WAVEFORM DATA FOR LEFT-CHANNEL DELAY |
| 3n + 15 | WAVER | WAVEFORM DATA OF RIGHT CHANNEL |
| 3n + 16 | WAVEL | WAVEFORM DATA OF LEFT CHANNEL |
| 3n + 17 | EWAVER | EFFECT SOUND WAVEFORM DATA OF RIGHT CHANNEL |
| 3n + 18 | EWAVEL | EFFECT SOUND WAVEFORM DATA OF LEFT CHANNEL |

FIG.20(a)

| ADDRESS | NAME | CONTENT |
|---|---|---|
| 0 ~ 11 | | AREA FOR LFO |
| 12 | DTIMER | DELAY TIME FOR RIGHT-CHANNEL DELAY EFFECT |
| 13 | DTIMEL | DELAY TIME FOR LEFT-CHANNEL DELAY EFFECT |
| 14 | DRPEATR | FEEDBACK AMOUNT OF RIGHT-CHANNEL DELAY EFFECT |
| 15 | DRPEATL | FEEDBACK AMOUNT OF LEFT-CHANNEL DELAY EFFECT |
| 16 | DDEPTHR | DEPTH OF RIGHT-CHANNEL DELAY EFFECT |
| 17 | DDEPTHL | DEPTH OF LEFT-CHANNEL DELAY EFFECT |
| 18 | CDEPTH | DEPTH OF CHORUS EFFECT |
| 19 | CDTIME | DELAY TIME OF CHORUS EFFECT |
| 20 ~ 20 + m | RT1R ~ DT m R | DELAY TIMES OF RIGHT-CHANNEL REVERBATION EFFECT |
| 21 + m ~ 21 + 2m | DT1L ~ DT m L | DELAY TIMES OF LEFT-CHANNEL REVERBATION EFFECT |
| 22 + 2m | RDEPTH | DEPTH OF REVERBATION EFFECT |

FIG.20(b)

| ADDRESS | NAME | CONTENT |
|---|---|---|
| 0 ~ n | to ~ tn | TIME DATA |
| n + 1 ~ 2n | Ro ~ Rn | ANGLE DATA |
| 2n + 1 ~ 3n | Do ~ Dn | CHANGE AMOUNT DATA |
| 3n + 1 | CPOINT | INPUT POINTER OF CHORUS EFFECT MEMORY |
| 3n + 2 | CERIAA | AREA SIZE OF CHORUS EFFECT MEMORY |
| 3n + 3 | CERIAO | START ADDRESS OF MEMORY AREA OF CHORUS EFFECT MEMORY |
| 3n + 4 | WAVER | RIGHT–CHANNEL AMPLITUDE DATA |
| 3n + 5 | WAVEL | LEFT–CHANNEL AMPLITUDE DATA |
| 3n + 6 | EWAVER | AMPLITUDE DATA OF RIGHT–CHANNEL EFFECT SOUND |
| 3n + 7 | EWAVEL | AMPLITUDE DATA OF LEFT–CHANNEL EFFECT DATA |

FIG.26(a)

| ADDRESS | NAME | CONTENT |
|---|---|---|
| 0 | T | PARAMETER FOR CHANGING TIME |
| 1 | R | PARAMETER FOR CHANGING ANGLE |
| 2 | C 1 | ANGLE DATA COUNTER |
| 3 | C 2 | TIME DATA COUNTER |
| 4 | C 3 | COUNTER INDICATING ADDRESS OF LFO WAVEFORM DATA |
| 5 | REG | ACCUMULATION VALUE OF CHANGE AMOUNT DATA |
| 6 | OFF 1 | START ADDRESS OF TIME DATA 0 |
| 7 | OFF 2 | START ADDRESS OF ANGLE DATA n + 1 |
| 8 | OFF 3 | START ADDRESS OF CHANGE AMOUNT DATA 2n + 1 |
| 9 | CA | UPPER LIMIT OF C 3 n |
| 10 | LFOH | INTEGER PART OUTPUT |
| 11 | LFOL | DECIMAL PART OUTPUT |
| 12 | CDTIME | DELAY TIME |
| 13 | CDEPTH | DEPTH OF CHORUS EFFECT |

FIG. 26 (b)

| ADDRESS | NAME | CONTENT |
|---|---|---|
| 0 ~ N | | LFO WAVEFORM DATA |
| N + 1 | WAVE 1 | INPUT SIGNAL WAVEFORM DATA |
| N + 2 | WAVE 2 | WAVEFORM DATA |

FIG. 34(a)

| ADDRESS | NAME | CONTENT |
|---|---|---|
| 0 | TMDPTH | DEPTH OF TREMOLO EFFECT |
| 1 | TMSPED | SPEED OF LFO |
| 2 | C 1 | COUNTER |
| 3 | C 2 | COUNTER |
| 4 | N | NUMBER OF LFO WAVEFORM DATA (UPPER LIMIT OF C 2) |
| 5 | H | DIVISION RESULT |
| 6 | LFOH | LFO OUTPUT |

FIG. 34(b)

EFFECT ADDITION APPARATUS

This application is a Continuation of application Ser. No. 07/233,325, filed Aug. 17, 1988 now abandoned.

BACKGROUND OF THE INVENTION

1. Field of the Invention

The present invention relates to an effect addition apparatus for adding a sound effect to an input signal.

2. Description of the Related Art

Various effect addition apparatuses for electronically adding effects such as chorus, echo, reverberation effects, and the like to a musical tone signal have been developed along with development of high-performance sound equipment. Some effect addition apparatuses employ an analog delay element such as a BBD. However, in an apparatus of this type, it is difficult to change effect characteristics, and an S/N ratio is considerably degraded. As a result, a natural effect tone cannot be obtained. In recent years, effect tones can be generated by real-time processing since digital signal processing techniques are improved, and high-speed, high-density logic elements are developed.

As an effect addition apparatus of this type, U.S. Pat. No. 4,472,993 (Futamese et al.) discloses a technique wherein a plurality of effect addition operations are time-divisionally performed by digital arithmetic processing, and the digital arithmetic processing contents in this case are desirably determined based on parameters and control data corresponding to the effects.

However, the conventional effect addition apparatus includes special-purpose circuits for an effect addition ciruit, and a tone color parameter changing means used for the effect addition operations, resulting in a complicated arrangement. When the tone color parameter is changed, the next waveform data depends on the previous waveform data. For this reason, a discontinuous point may be produced in waveform data to be stored or waveform data may be discontinuously read out, thus generating noise.

U.S. Pat. No. 4,570,523 (Futamese et al.) discloses a technique wherein a digital memory is used as a delay element, amplitude data obtained by sampling an input musical tone at a predetermined cycle are sequentially stored in the digital memory, and the amplitude data corresponding to a desired delay time is read out and is converted to an analog signal, thus generating a reverberation tone.

However, the technique in U.S. Pat. No. 4,570,523 has no disclosure about changing of a tone color parameter, and the problem of noise is left unsolved.

SUMMARY OF THE INVENTION

It is an object of the present invention to provide an effect tone addition apparatus which can prevent generation of noise in an effect tone when a tone color parameter which determines effect tone characteristics is changed.

It is another object of the present invention to provide an effect addition apparatus using a low-frequency function waveform signal.

effect addition means having delay means for sequentially storing at least input signal data and delaying and outputting a storage content thereof;

tone volume adjusting means arranged at both input and output sides of said effect addition means;

clearing means for clearing the storage content of said delay means; and changing control means for controlling said tone volume adjusting means so that input and output volumes of said effect addition means are gradually decreased and causing said clearing means to clear the storage content of said delay means, and then changing a tone color parameter for determining the effect of said effect addition means and gradually recovering the tone volumes.

According to the present invention, no noise is produced when the tone color parameter is changed.

The amplitude or frequency of a function waveform signal is varied, so that chorus or reverberation modulation effects having various delay characteristics (delay time, a period at which the delay time changes, and the like) can be added.

BRIEF DESCRIPTION OF THE DRAWINGS

FIGS. 4(*a*) and 4(*b*) are views showing internal arrangements of tone color parameter memories in the first embodiment shown in FIG. 3;

FIGS. 12(*a*) and 12(*b*) are views showing internal arrangements of tone color parameter memories in the second embodiment shown in FIG. 3;

FIG. 20(*a*) is a view showing an internal arrangement of tone color parameter memory 55 in the third embodiment shown in FIG. 19;

FIG. 20(*b*) is a view showing an internal arrangement of tone color parameter memory 56 in the third embodiment shown in FIG. 19;

FIG. 26(*a*) is a view showing an internal arrangement of tone color parameter memory 55 in the fourth embodiment;

FIG. 26(*b*) is a view showing an internal arrangement of tone color parameter memory 56 in the fourth embodiment;

FIG. 34(*a*) is a view showing an internal arrangement of tone color parameter memory 55 shown in FIG. 19;

FIG. 34(*b*) is a view showing an internal arrangement of parameter memory 56 shown in FIG. 19;

PREFERRED EMBODIMENTS OF THE INVENTION

First Embodiment

Figure 1:
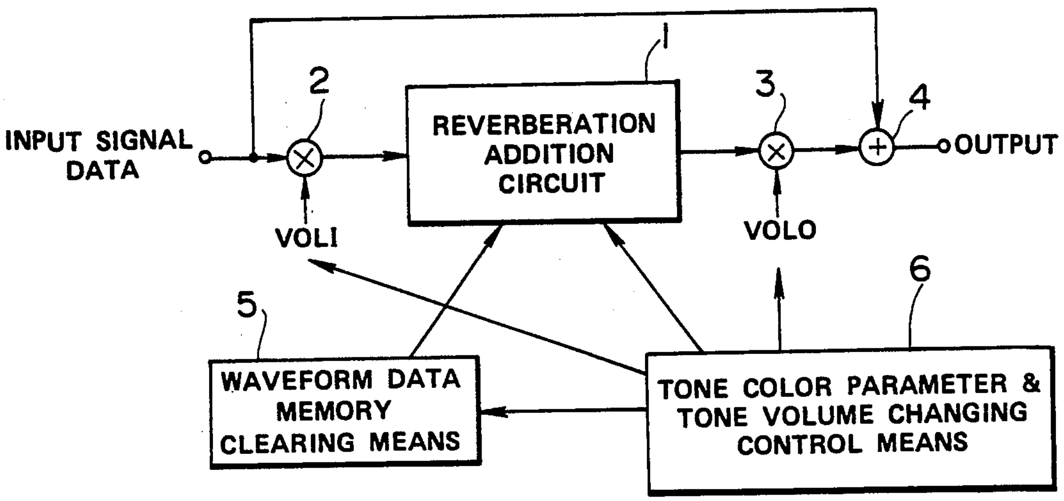
FIG. 1 is a block diagram showing an effect addition apparatus according to a first embodiment of the present invention.

A first embodiment of an effect addition apparatus according to the present invention will be described hereinafter with reference to FIGS. 1 to 10. The apparatus of the first embodiment is an apparatus for adding a reverberation effect to an original musical tone signal.

Schematic Description of Operation using Principle Block Diagram

The operation principle of the apparatus according to the first embodiment will be described below with reference to FIGS. 1 and 2.

In the block diagram of FIG. 1, reverberation addition circuit 1 is mainly constituted by a delay circuit used as a waveform data memory, which will be described in detail later with reference to FIG. 2. The input and output terminals of reverberation addition circuit 1 are respectively connected to multipliers 2 and 3 for adjusting a tone volume. The output terminal of multiplier 3 is connected to adder 4 for adding data output from multiplier 3 to input signal data and outputting sum data. Waveform data memory clearing means 5 is arranged to clear the content of a waveform data memory in addition circuit 1. Changing control means 6 for changing a tone color parameter and a tone volume controls tone color parameters consisting of delay times (t1 to t4) and feedback multiplicators (g1 to g4) for determining reverberation characteristics of addition circuit 1, an input tone volume (VOLI) corresponding to the output level of multiplier 2, an output tone volume (VOLO) corresponding to the output level of multiplier 3, and the operation of waveform data memory clearing means 5 in accordance with a processing means (to be described later).

Figure 2:
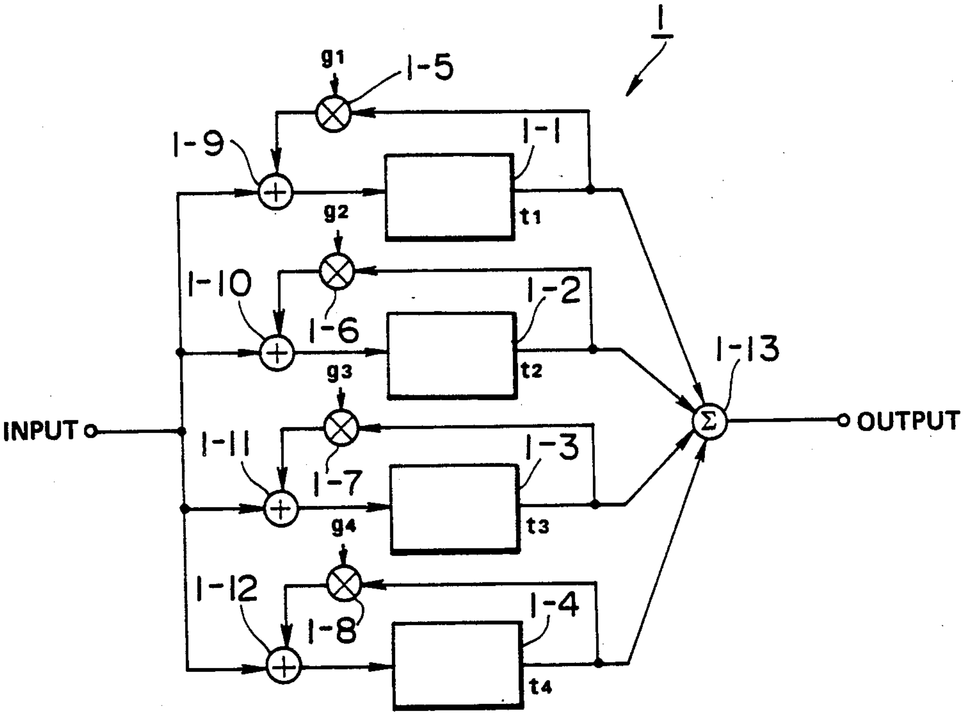
FIG. 2 is a block diagram showing a reverberation addition circuit shown in FIG. 1.

FIG. 2 is a block diagram showing an internal arrangement of reverberation addition circuit 1 as shown in FIG. 1. As shown in FIG. 2, addition circuit 1 has a plurality of (in this embodiment, four) delay circuits 1-1, 1-2, 1-3, and 1-4, in which delay times (t1 to t4) are respectively set. Delay circuits 1-1 to 1-4 comprise, e.g., shift registers, and serve as waveform data memories. On feedback loops of delay circuits 1-1 to 1-4, multipliers 1-5, 1-6, 1-7, and 1-8 for multiplying feedback multiplicators (g1 to g4) are arranged. Feedback signal data from multipliers 1-5 to 1-8 are added to common input signal data by adders 1-9, 1-10, 1-11, and 1-12 arranged at the input side of delay circuits 1-1 to 1-4, respectively. The outputs from delay circuits 1-1 to 1-4 are added to each other by adder 1-13, and sum data is then output. The storage contents of delay circuits 1-1 to 1-4 are cleared by clearing means 5 after an input/output tone volume is decreased. More specifically, the data erasure can be cleared by writing all "0" data in the shift registers. Although not shown in FIG. 2, such a write circuit can be realized by a plurality of gate circuits, or the like. The delay times (t1 to t4) of delay circuits 1-1 to 1-4 and the feedback multiplicators of multipliers 1-5 to 1-8 are changed under the control of changing control means 6 after the storage contents of delay circuits 1-1 to 1-4 are cleared. The delay times (t1 to t4) can be changed by selecting output shift stages of the shift registers. In other words, the delay times can be easily changed if a storage content can be easily fetched as an output signal from each shift stage.

The operation of the apparatus for adding a reverberation effect with the above arrangement will be described below.

Predetermined feedback multiplicators (g1 to g4) and delay times (t1 to t4) are set as tone color parameters for providing a reverberation effect, and input and output tone volumes (VOLI, VOLO) are set to be a predetermined value (e.g., 1.0). Input signal data is added to predetermined reverberation tones by delay circuits 1-1 to 1-4 and their feedback loops in reverberation addition circuit 1, and the obtained data is output from adder 4.

When the tone color parameters (delay times and feedbcak multiplicators) are changed in a state wherein the predetermined reverberation tones are added, tone volumes VOLI and VOLO of multipliers 2 and 3 are gradually decreased to "0" by changing control means 6. Then, externally input tone color parameters (delay times t1 to t4, feedback multiplicators g1 to g4) of addition circuit 1 are set by changing control means 6. Thereafter, all "0" data is stored in the waveform data memories in addition circuit 1 by clearing means 5, thereby clearing the storage contents of the memories. The tone volumes of multipliers 3 and 4 are gradually changed to an original value (e.g., 1.0) by changing control means 6. Note that each delay time ti and feedback multiplicator gi (i=1 to 4) are preferably set to yield ti×gi=constant in order to obtain a constant reverberation time. In this case, a condition of obtaining satisfactory reverberation characteristics is to randomly set ti and gi to satisfy the above relation.

When the above operation is performed, since the tone volumes are set to be "0" during changing of the tone color parameters, no noise is produced. Since the tone volumes are recovered to an original value after all the contents of the waveform data memories are cleared, waveform ddata can be prevented from being discontinuously written in the waveform data memories or from being discontinuously read out therefrom, resulting in no noise. Therefore, in the apparatus for adding a reverberation effect, the tone color parameters can be changed without producing noise.

Detailed Circuit Arrangement

The circuit arrangement of the apparatus for adding a reverberation tone as an embodiment of the above-mentioned operation principle will be described below with reference to FIG. 3 and FIGS. 4(*a*) and 4(*b*).

Figure 3:
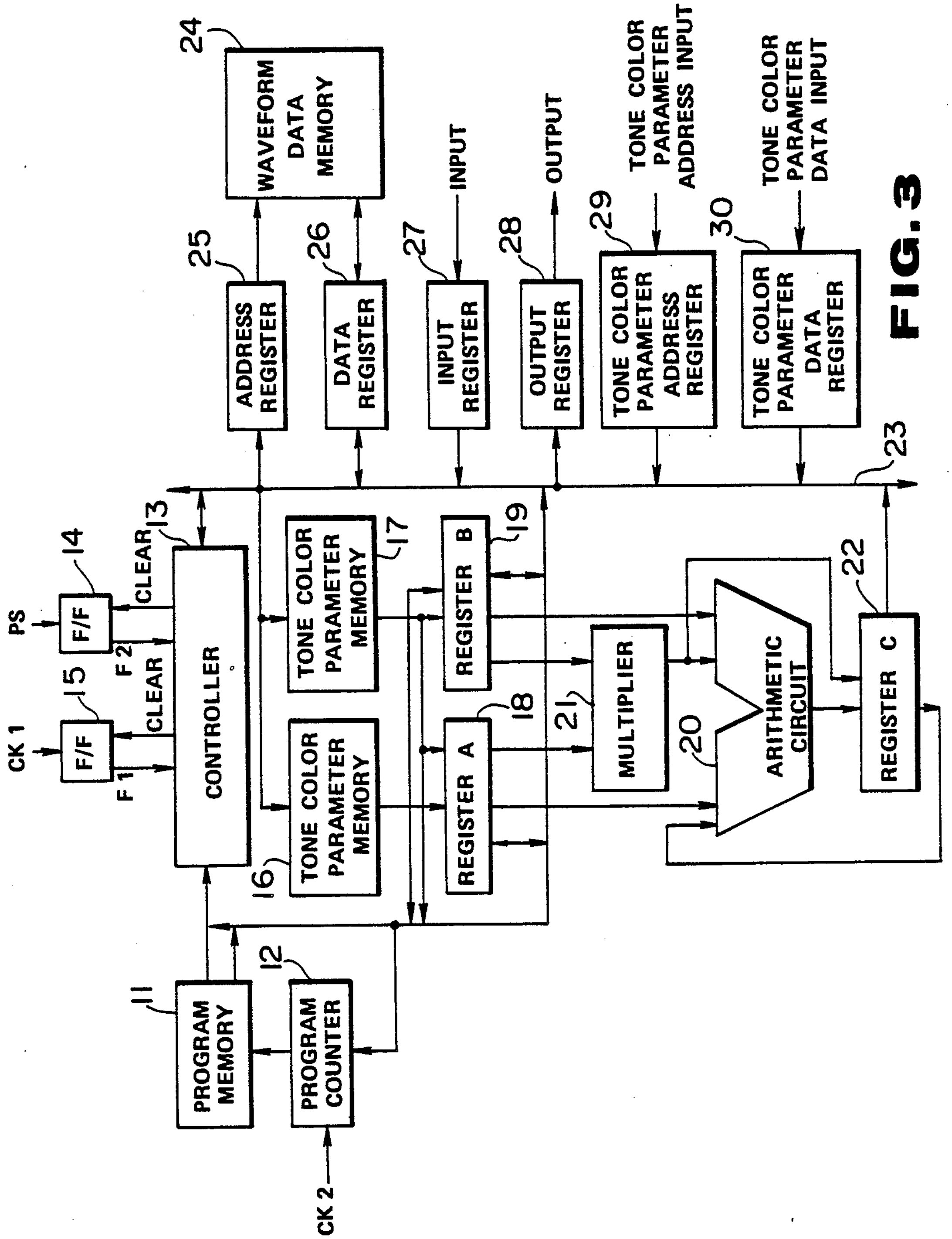
FIG. 3 is a block diagram showing the detailed arrangement of an effect addition apparatus according to the first and second embodiments.

FIG. 3 is a block diagram showing an apparatus for adding a reverberation tone, which realizes the same functions as those of the principle circuit shown in FIGS. 1 and 2. The circuit shown in FIG. 3 comprises an integrated digital signal processor.

In FIG. 3, program memory 11 is a memory for storing predetermined programs. Memory 11 receives, as address data, the output from program counter 12 which is incremented in response to clock signal CK2 supplied from a clock generator (not shown). An addressed program is supplied to controller 13. Controller 13 controls data transfer between registers and memories, a variety of arithmetic operations, an address data supply timing to program counter 12, and the like, in accordance with the content of the program supplied from program memory 11. Flip-flop 14 changes its state in response to external signal PS during changing of the tone color parameters, and supplies operation switch signal F2 to controller 13. Controller 13 supplies a clear signal to flip-flop 14. Flip-flop 15 changes its state in response to external sampling clock CK1, and supplies signal F1 to controller 13. Controller 13 supplies a clear signal to flip-flop 15. Note that clock signal CK2 supplied to program counter 12 is sufficiently shorter than external sampling clock CK1 supplied to flip-flop 15.

Tone color parameter memories 16 and 17 store tone color parameters for adding a reverberation effect, constants used in arithmetic operations, and some of waveform data, as will be described later in detail with reference to FIGS. 4(*a*) and 4(*b*).

Registers A 18 and B 19 receive data from tone color parameter memories 16 and 17 or registers (to be described later), and output data to arithmetic circuit 20 for performing addition/substraction and multiplier 21. The arithmetic operation results from arithmetic circuit 20 and multiplier 21 are supplied to register C 22. The output from register C 22 is supplied to arithmetic circuit 20 or to respective sections through internal bus 23.

Waveform data memory 24 is a memory for storing waveform data, and receives write and read address data from address register 25. Data written in and read out from waveform data memory 24 are stored in data register 26.

Note that waveform data memory 24 comprises a RAM, and its function corresponds to delay circuits 1-1 to 1-4 in the block diagram of FIG. 2. The memory capacity of memory 24 is divided into four sections, which respectively serve as first, second, third, and fourth delay circuits. For data register 26, data transfer is performed through internal bus 23.

Input register 27 stores digital input signal data from a tone source (not shown), and supplies tha data to respective sections. Output register 28 stores output signal data, and supplies the data to an external circuit. The output signal data is converted to a tone with a reverberation effect and output through a digital-to-analog converter, a low-pass filter, an output amplifier, and the like.

Tone color parameter address register 29 and tone color parameter data register 30 respectively receive addresses and data of tone parameter memories 16 and 17 which are supplied externally. Registers 29 and 30 are used during changing of the tone color parameters.

The internal arrangements of tone color parameter memories 16 and 17 will be described with reference to FIGS. 4(*a*) and 4(*b*).

FIG. 4(*a*) shows the internal arrangement of tone color parameter memory 16. Output contents (RD1 to RD4) from the first to fourth delay circuits before one sampling period are stored at addresses "0" to "3", respectively. A memory capacity FFFh (DW) of an area of waveform data memory 24 used for one delay circuit is stored at address "4". Note that FFFh is an address in hexadecimal notation, and h is a symbol representing hexadecimal notation. Start addresses 0000h (DS1), 1000h (DS2), 2000h (DS3), and 3000h (DS4) of areas of waveform data memory 24 used as the first to fourth delay circuits are stored at addresses "5" to "8". A constant "0" (ZERO) is stores at address "9"; a constant 0001h (ONE), addresses "10"; the content of a counter (MC) indicating the operation state during changing of parameters; address "11"; the content of an address counter (CRC) used when waveform data memory 24 is cleared, address "12"; an end address (CR1) of an area of waveform data memory 24 used, address "13"; and the content "WAVE" of input signal data ×VOLI, address "14".

FIG. 4(*b*) shows the internal arrangement of tone color parameter memory 17. Feedback multiplicators (g1 to g4) of the first to fourth delay ciruits are respectively stored at addresses "0" to "3"; delay times (t1 to t4) of the first to fourth delay circuits, addresses "4" to "7"; an input tone volume (VOLI), address "8"; an output tone volume (VOLO), address "9"; and the contents of write address counters (AD1 to AD4) to the first to fourth delay circuits, addresses "10" to "13". At address "14", address "8" or "9" of the input/output tone volume (VOLI, VOLO) is stored as (SEA) when the input/output tone volume (VOLI, VOLO) is gradually changed. A target value (SED) of the input/output tone volume to be changed is stored at address "15"; the content (SEC) of a counter for counting a change time of the input/output tone volume, address "16"; an initial value (SEI) of the input/output tone volume, address "17"; and a multiplicator (SEG) for determining a rate of change of the input/output tone volume, address "18". Each of the delay times (t1 to t4) is different from one achieved by controlling the output stage number of the shift register in the block diagram of FIG. 2, and indicates a difference between addresses on waveform data memory 24, i.e., between an address at which the present waveform is written and a read address from which the previously written waveform is read out. That is, the delay time indicates a value obtained by substracting an original delay time from capacity DW of waveform data memory 24 used by one delay circuit, as will be described later in detail.

Detailed Circuit Operation

The operation of the apparatus for adding the reverberation effect with the above arrangement will be described hereinafter in detail with reference to FIGS. 5 to 10.

Figure 5:
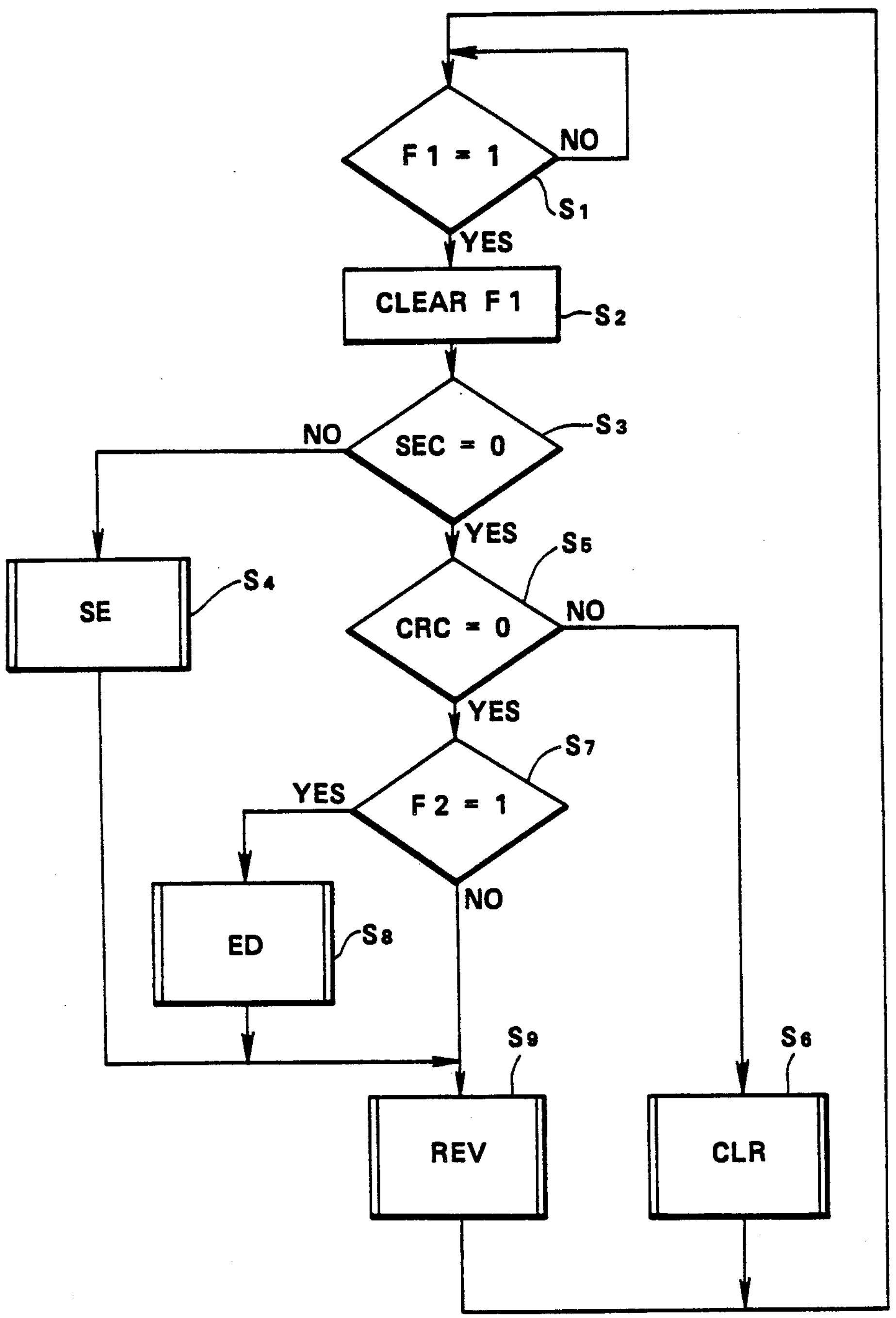
FIG. 5 is a flow chart showing the overall processing operation of the effect addition apparatus according to the first embodiment.

The flow chart of FIG. 5 shows the overall processing operation of the apparatus for adding the reverberation effect. It is checked in step S1 in FIG. 5 if the state (F1) of flip-flop 15 is "1". More specifically, when F1 = 1 in response to the leading edge of external sampling clock CK1, signal F1 is supplied to controller 13, so that controller 13 supplies a count start signal to program counter 12. Program counter 12 increments its count in synchronism with clock signal CK2, and supplies address data to program memory 11. The content of program memory 11 is supplied to controller 13, thus controlling the respective sections. In step S2, controller 13 supplies the clear signal to flip-flop 15, thus clearing flip-flop 15 (F1=0).

It is then checked in step S3 if the content of (SEC) for counting a change time when the input/output tone volum (VOLI, VOLO) is gradually changed is "0". The content of (SEC) becomes (SEC≠0) when the input/output tone volume is changed; otherwise, becomes (SEC=0). If NO in step S3, the flow advances to step S4 (block SE) of gradually changing the input/output tone volume (VOLI, VOLO) (to be described later). If YES in step S3, the flow advances to step S5 to check if the content (CRC) of the address counter used when waveform data memory 24 is cleared is "0". The content (CRC) becomes (CRC≠0 ) when waveform data memory 24 is cleared; otherwise, becomes (CRC=0). If NO in step S5, the flow advances to step S6 (block CLR) of clearing waveform data memory 24. However, if YES in step S5, the flow advances to step S7 to check if the state (F2) of flip-flop 14 is "1". The state (F2) of flip-flop 14 is controlled by external signal PS. When a tone color parameter is fetched from an external circuit, (F2=1); otherwise, (F2≠1). If YES in step S7, the flow advances to step S8 (block ED) of fetching a tone color parameter from an external circuit. Note that when the tone color parameters (g1 to g4, t1 to t4) are changed, addresses "0" to "7" of tone color parameter memory 17 are set in tone color parameter address register 29, and changed values are set in tone color parameter data register 30, as will be described later in detail. If NO in step S7, the flow advances to step S9 (block REV) of executing addition of a reverberation effect. After execution of (block SE) in step S4 and (block ED) in step S8, the flow advances to step S9 (block REV). After execution of (block CLR) in step S8 and (block REV) in step S9, the flow returns to step S1, and the same processing is repeated.

When only addition of a reverberation effect is executed without changing the tone color parameters, the content (SEC) of the counter for counting the change time of the input/output tone volume, and the content (CRC) of the address counter used when waveform data memory 24 is cleared become "0", and the state of flip-flop 14 is (F2=0). Therefore, the processing in step S9 is repeated. In order to change the tone color parameters, when external data are respectively set in registers 29 and 30 and signal PS is supplied to flip-flop 14, F2 becomes "1", and block ED (step S8) for fetching the tone color parameter, and block REV (step S9) are executed.

Figure 6:
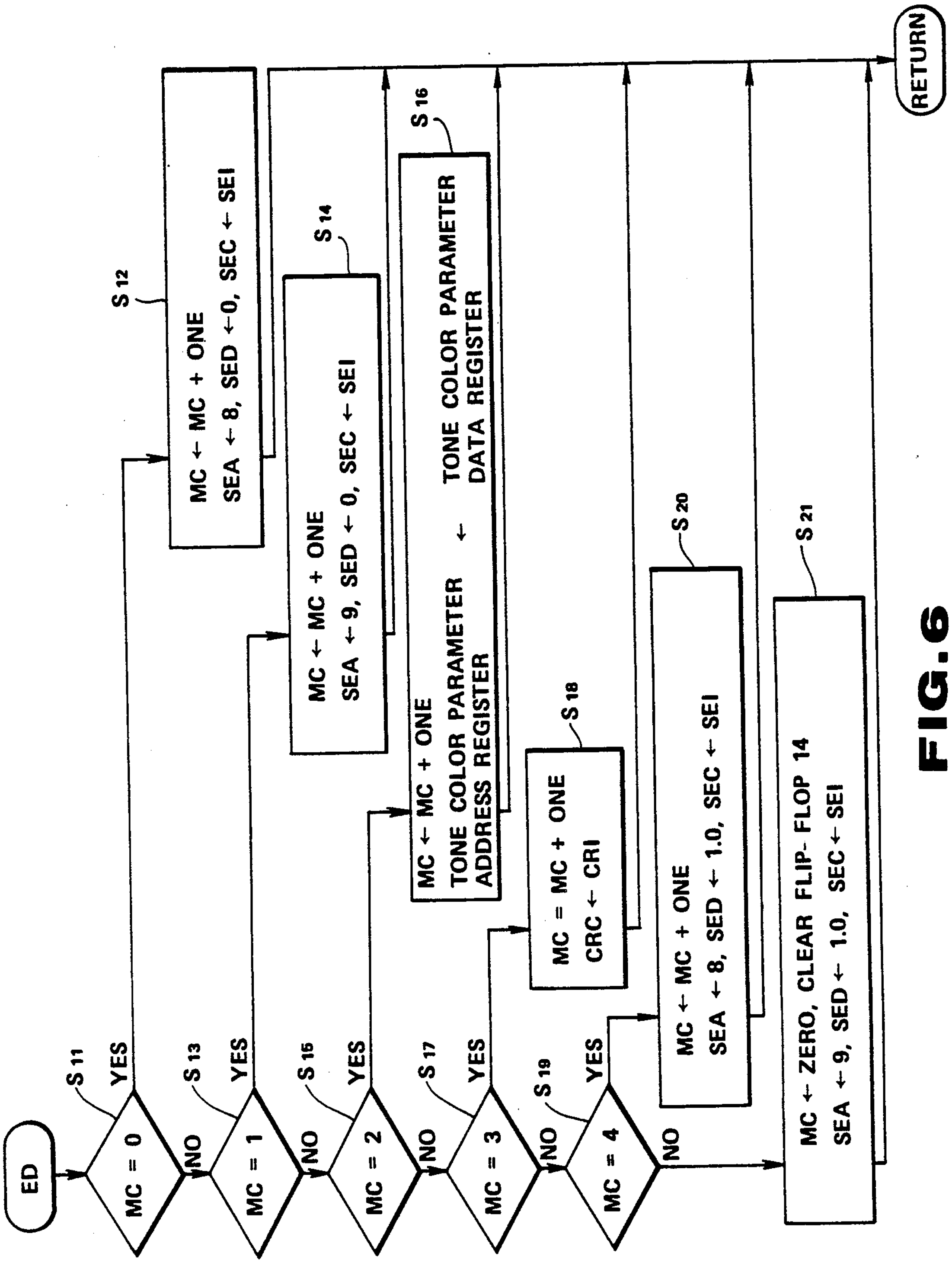
FIG. 6 is a flow chart showing a processing operation of block ED for fetching a tone color parameter shown in FIG. 5.

The flow chart of FIG. 6 shows the processing operation in block ED for fetching the tone color parameter. It is checked in step S11 in FIG. 6 if (MC) is equal to "0". Since the content of (MC) is initially set to be "0", the flow advances to step S12. In step S12, (MC) is incremented (MC←MC+ONE), address "8" of an area for storing an input tone volume (VOLI) is set in (SEA) (SEA←8), target value "0" to be attained is set in (SED) (SED←0), and initial value (SEI) is set in (SEC) (SEC←SEI). The series of processing operations in step S12 are initial setting of gradually decreasing the input tone volume (VOLI) to "0". The processing of gradually decreasing the input tone volume (VOLI) to "0" is executed in block SE. When control returns to the processing of block ED for the next time, i.e., when the input tone volume (VOLI) becomes "0", the flow advances from step S11 to step S13 to check if (MC) is "1". Since the content of (MC) has already been set to be "1" in step S12, the flow advances to step S14. In step S14, (MC) is incremented (MC←MC +ONE), address "9" of an area for storing the output tone volume (VOLO) is set in (SEA) (SEA←9), target value "0" to be attained is set in (SED) (SED ←0), and the initial value (SEI) is set in (SEC) (SEC←SEI). The series of processing operations in step S14 are initial setting of gradually decreasing the output tone volume (VOLO) to "0". The processing of gradually decreasing the output tone volume (VOLO) to "0" is executed in block SE as in step S12. When control returns to the processing of block ED for the next time, i.e., when the output tone volume (VOLO) becomes "0", the flow advances to step S15 through steps S11 and S13 to check if (MC) is "2". Since (MC) has already been set to be "2" in step S14, the flow advances to step S16. In step S16, (MC) is incremented (MC←MC +ONE), and the value of tone color parameter data register 30 is written at one of addresses (0 to 7) of tone color parameter memory 17 indicated by tone color parameter address register 29 ([tone color parameter address register]← tone color parameter data register). By the processing in step S16, a tone control parameter to be changes is stored in tone color parameter memory 17. When control returns to the processing of block ED for next time, the flow advances to step S17 through steps S11, S13, and S15 to check if the content of (MC) is "3". Since the content of (MC) has already been set to be "3" in step S16, the flow advances to step S18. In step S18, (MC) is incremented (MC←MC+ONE), and the end address (CRI) of waveform data memory 24 as an initial value is set in the content (CRC) of the address counter used when waveform data memory 24 is cleared (CRC←CRI). By the processing of step S18, initial setting for sequentially clearly data from the end address of waveform data memory 24 is performed. The processing of clearing waveform data memory 24 is executed in block CLR. When control returns to the processing of block ED for the next time, i.e., when the content of waveform data memory 24 is cleared, the flow advances to step S19 through steps S11, S13, S15, and S17 to check if the content of (MC) is "4". Since the content of (MC) has already been set to be "4" in step S18, the flow advances to step S20. In step S20, (MC) is incremented (MC←MC+ONE), address "8" of an area for storing the input tone volume (VOLI) is set in (SEA) (SEA←8), the target value "1.0" to be attained is set in (SED) (SED←1.0), and the initial value (SEI) is set in (SEC) (SEC←SEI). By the processing in step S20, initial setting for recovering the input tone volume (VOLI) from "0" to "1" is executed. When control returns to the processing of block ED for the next time, i.e., when the input tone volume (VOLI) has reached an original value, since (MC) has already been set to be "4" in step S20, the flow advances to step S21 through steps S11, S13, S15, S17, and S19. In step S21, (MC) is set to be "0" (MC ZERO), flip-flop 14 is cleared (F2=0), address "9" of an areas for storing the output tone volume (VOLO) is set in (SEA) (SEA←9), the target value to be attained "1.0" is set in (SED) (SED←1.0), and the initial value (SEI) is set in (SEC). By the processing in step S21, initial setting for gradually recovering the output tone volume from "0" to "1" is performed, and (MC) becomes "0" to be ready for the next tone color parameter changing operation. In addition, the state of flip-flop 14 is cleared to the initial state. The processing of gradually increasing the output tone volume (VOLO) from "0" to "1" is executed in block SE as in step S20.

Figure 7:
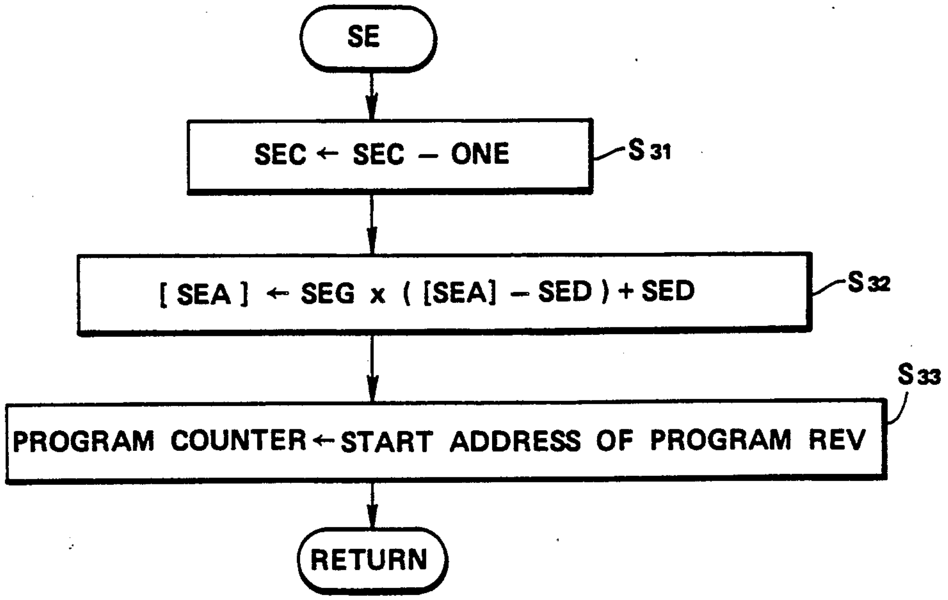
FIG. 7 is a flow chart showing a processing operation of block SE for gradually changing an input/output tone volume shown in FIG. 5.

The flow chart in FIG. 7 shows the processing operation of block SE for gradually changing the input/output tone volume. Block SE corresponds to input/output tone volume changing control means 6 shown in FIG. 1. In step S31 in FIG. 7, "1" is subtracted from the content of (SEC) (SEC←SEC−ONE). In step S32, a value obtained by subtracting the target value (SED) to be attained from the tone volume (VOLI or VOLO) stored at address "8" or "9" indicated by (SEA) is multiplied with multiplicator (SEG) for determining a rate of change, and a value obtained by adding the product to (SED) is set at an address indicated by (SEA) as tone volume data ([SEA]←SEG×([SEA]−SED+SED). In the processisng in step S32, an arithmetic operation of multiplying a difference between the input/output tone volume and the target value to be attained with a multiplicator for determining a rate of change is performed to gradually change the input/output tone volume. In step S33, the start address of a program for performing processing of adding a reverberation effect is set in program counter 12. Thus, control enters block REV for adding a reverberation tone. The processing in FIG. 7 is repetitively executed until the initial values (SEI) initially set in (SEC) in steps S12, S14, S20, and S21 in the processing in FIG. 6 become "0" or "1", and the input/output tone volume (VOLI, VOLO) is exponentially changed.

Figure 8:
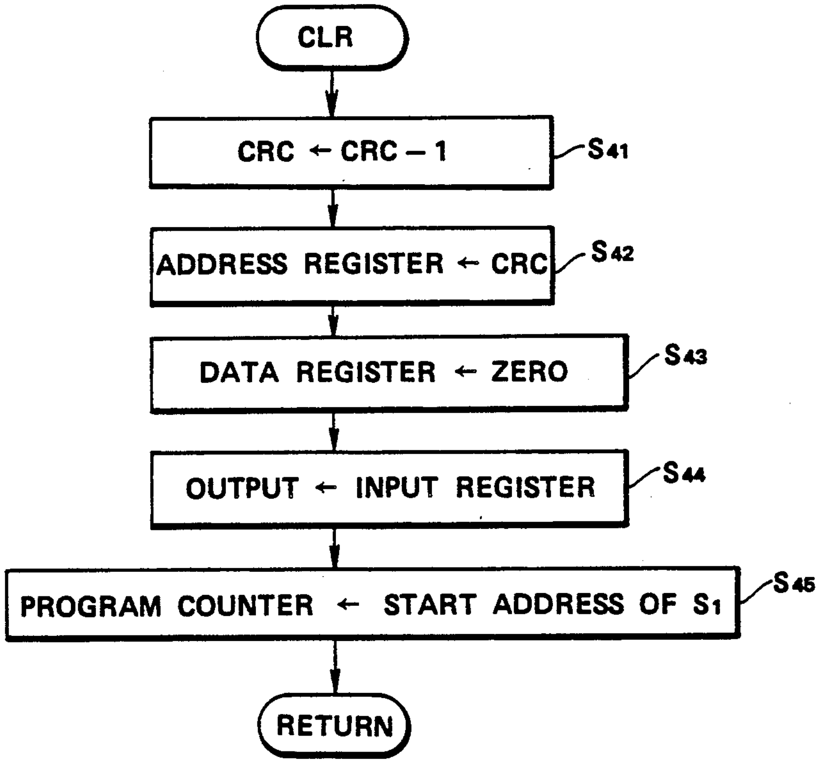
FIG. 8 is a flow chart showing a processing operation of block CLR for clearing a waveform data memory shown in FIG. 5.

The flow chart shown in FIG. 8 shows the processing operation of block CLR for clearing the content of the waveform data memory. Block CLR corresponds to waveform data memory clearing means 5 in FIG. 1, and is executed after the initial setting for clearing the waveform data memory is performed in step S18 in FIG. 6. In step S41 in FIG. 8, the immediately preceding address is calculated from the value of (CRC) by subtraction (CRC←CRC−1). In step S42, the value of (CRC) calculated in step S41 is transferred to address register 25 (address register ←CRC). In step S43, "0" is transferred to data register 26 (data register ←ZERO). The input data signal stored in input register 27 is transferred to output register 28 (output register ←input register). In step S45, the start address of the processing for executing step S1 in FIG. 5 is set in program counter 12 (program counter ←start address of S1). More specifically, since the processing in FIG. 8 is repetitively executed, "0" is written sequentially from the end address to the start address of waveform data memory 24, thus clearing the content of memory 24. While erasure of memory 24 is performed, the input signal data is directly output without being subjected to processing such as reverberation effect addition, in step S44.

Figure 9:
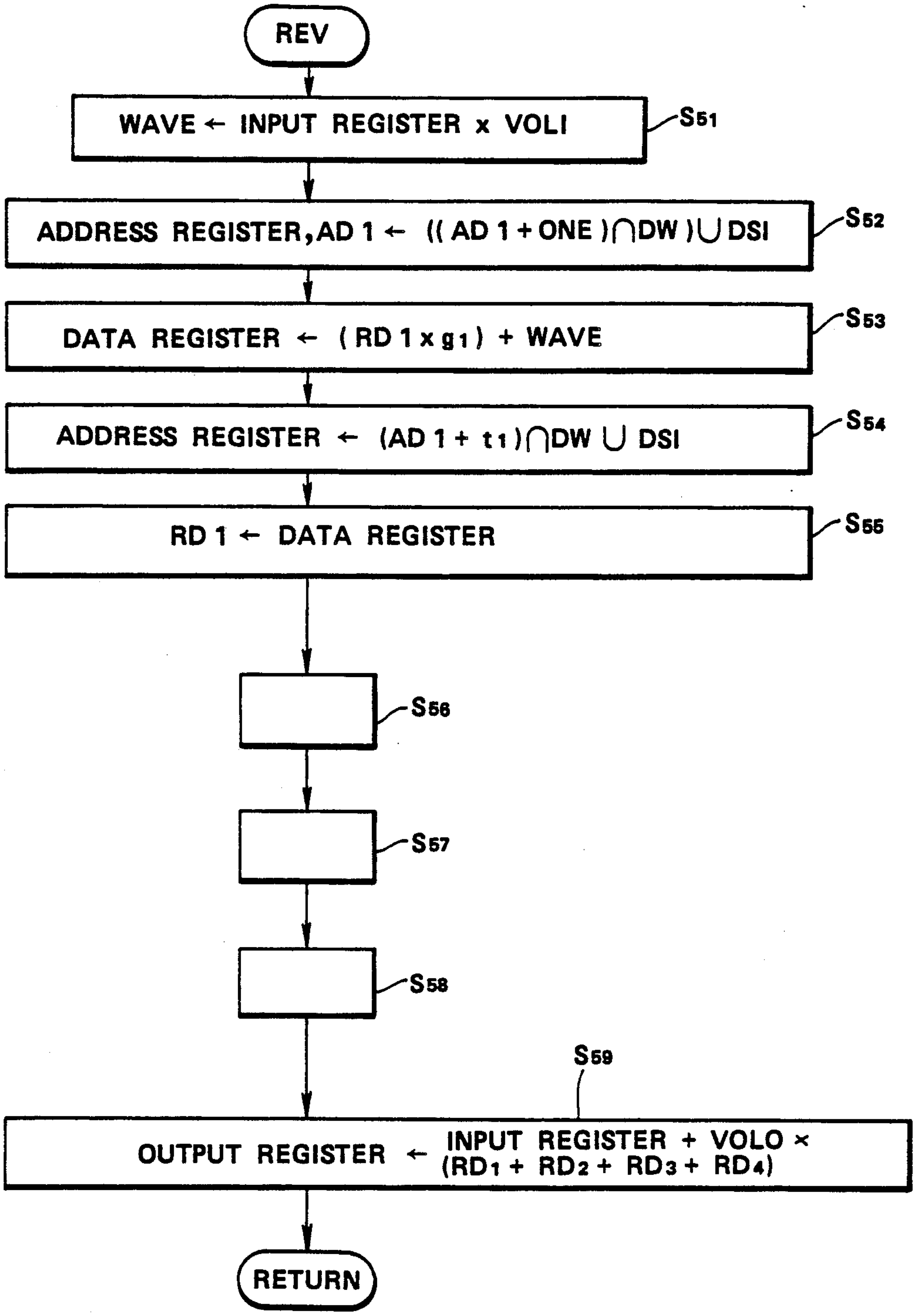
FIG. 9 is a flow chart showing a processing operation of block REV for adding an effect shown in FIG. 5.
Figure 10:
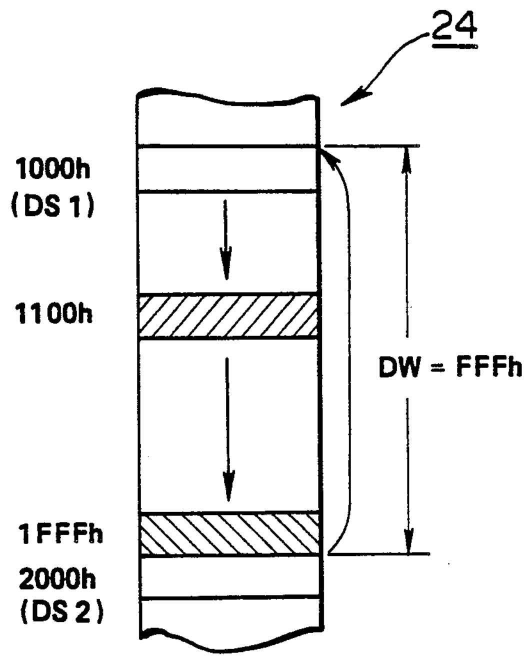
FIG. 10 is a view for explaining a write address of the waveform data memory in the first and second embodiments.

The flow chart shown in FIG. 9 shows a processing operation of block REV for adding a reverberation effect. Block REV is executed after block SE of gradually changing the input/output tone volume and block ED of fetching the tone color parameter are executed. In step S51 in FIG. 9, the value of (VOLI) is multiplied with a value set in input register 27, and the product is set in (WAVE). More specifically, this processing corresponds to multiplication processing of the input tone volume (VOLI) in multiplier 2 in FIG. 1. A value obtained by incrementing the content of (AD1), and (DW) are ANDed in units of bits, and a value obtained by ORing the AND result and (DS1) is set in (AD1). The content of (AD1) is set in address register 25 (AD1←(-(AD1+ONE) ∩ DW) ∪ DS1). More specifically, when the value obtained by incrementing the content of (AD1) falls within the range of 1000 h to 1 FFFH in waveform data memory 24, as shown in FIG. 10, the incremented value becomes the content of (AD1). When the incremented value becomes the content of (AD1). When the incremented value has reached 2000 h, the start address 1000 h is set in the content of (AD1). For example, when the value obtained by incrementing the content of (AD1) is 1100 h, 0 FFFH and FFFH are ANDed in units of bits to yield 0100 h. 0100 h and the start address 1000 h are ORed to yield 1100 h as an original value. When the value obtained by incrementing the content of (AD1) is 2000 h, 0 FFFH and FFFH are ANDed in units of bits to yield 0000 h, and 0000 h and 1000 h are ORed to yield 1000 h. In step S53, a value obtained such that (RD1) is multiplied with g1 and (WAVE) is added to the product, is set in data register 26. The value of data register 26 is written at an address of waveform data memory 24 designated by address register 25. More specifically, the arithmetic operation is performed such that a value obtained by multiplying the output from the first delay circuit in the immediately preceding sampling period with feedback multiplicator g1 is added to a value obtained by multiplying the input data with (VOLI), and the sum is written in the first delay circuit. In step S54 in FIG. 9, a value obtained by adding the content of (AD1) to t1 and (DW) are ANDed in unit of bits, and the AND result and (DS1) are ORed. The OR result is set in address register 25 (address register←(AD1+t1) ∩ DW ∪ DS1). The logic arithmetic operation in step S54 is to perform the same processing as in step S52. In step S54, addressing is performed to read out waveform data in an area incremented by an address corresponding to t1. In this embodiment, a value (DW−t1) corresponds to an original delay time because waveform data stored at an address after t1 is previous waveform data of (DW−t1) in FIG. 10. In step S55, the value which is read out from the address of waveform data memory 24 designated by address register 25 and is set in data register 27 is stored in (RD1) (RD←data register).

In steps S56, S57, and S58, the same processing as in steps S52, to S55 is executed for the second to fourth delay circuits. In steps S59, a value obtained by multiplying a total value of (RD1) to (RD4) with (VOLO) is added to the value in input register 27, and the sum is stored in output register 28. The value stored in output register 28 is then output to an external circuit. More specifically, this processing corresponds to the following operation in FIGS. 1 and 2. That is, the outputs from delay circuits 1-1 to 1-4 are totaled by adder 1-13, the total value is multiplied with (VOLO) by multiplier 3, and the product is added to the input signal data by adder 4.

In this manner, in the first embodiment, when the tone color parameters are rewritten, the input and output tone volumes are sequentially reduced to "0", and thereafter, the tone color parameters are changed. Then, all the contents of the waveform data memory are cleared, and the input and output tone volumes are recovered to an original state. Thus, generation of noise due to changing of the tone color parameters can be prevented.

Note that the apparatus of the first embodiment is designed to add a reverberation effect. However, the present invention can be similarly applied to various other effect addition apparatuses using delay circuits.

In the first embodiment, when the tone color parameters are changed, the input tone volume is changed first, and then, the output tone volume is changed. However, the input and output tone volumes can be changed in an order opposite to the above or simultaneously. A change speed of the tone volumes can be arbitrary set. When the tone volumes are gradually changed in a sufficiently long period of time, only one of the input and output tone volumes can be changed.

In the first embodiment, the input/output tone volume is gradually changed to "0". However, the input/output volume need only be reduced to a level low enough to eliminate the influence of noise.

The number of delay circuits, the capacitance of the waveform data memory, and the like can be arbitrarily selected, and are not limited to those in the first embodiment.

Second Embodiment

A second embodiment of an effect addition apparatus according to the present invention will be described hereinafter with reference to FIGS. 2, 3, 7, 9, 10, and 11 to 14. The apparatus of the second embodiment time-divisionally performs an operation of adding a reverberation effect, and a changing operation of a tone color parameter by arithmetic operations.

Schematic Description of Operation using Principle Block Diagram

The operation priniple of the apparatus according to the second embodiment will be described with reference to FIGS. 11 and 2.

Figure 11:
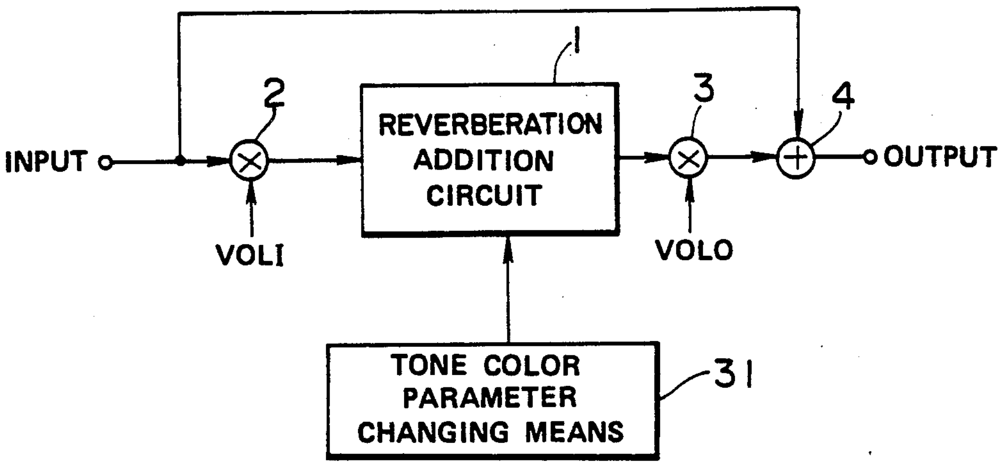
FIG. 11 is a functional block diagram of an effect addition apparatus according to the second embodiment of the present invention.

FIG. 11 is a function block diagram of the principle, and the same reference numerals as in FIG. 1 in the first embodiment denote the same blocks in FIG. 11. In FIG. 11, reverberation addition circuit 1 is mainly constituted by a delay circuit used as a waveform data memory. The internal arrangement of circuit 1 is the same as that in FIG. 2 described in the first embodiment. The input and output terminals of circuit 1 are respectively connected to multipliers 2 and 3 for adjusting a tone volume. The output terminal of multiplier 3 is connected to adder 4 for adding the output data from multiplier 3 and input signal data, and outputting sum data. Tone color parameter changing means 31 gradually changes tone color parameters consisting of delay times (t1 to t4) and feedback multiplicators (g1 to g4) for determining reverberation characteristics in accordance with processing procedures to be described later.

The operation of the apparatus for adding a reverberation effect shown in FIGS. 11 and 2 will be described below.

As tone color parameters for providing an effect tone, predetermined feedback multiplicators (g1 to g4) and delay times (t1 to t4) are set, and input and output tone volumes are also set to be a predetermined value (e.g. 1.0). Input signal data is added with a reverberation effect by delay circuits 1-1, 1-2, 1-3, and 1-4, and their feedback loops in addition circuit 1, and is output from adder 4. The effect addition processing is time-divisionally performed in a detailed circuit to be described later in each of delay circuits 1-1, 1-2, 1-3, and 1-4.

When a tone color parameter (delay time and feedback multiplicator) is changed in a state wherein the reverberation effect is added, the parameter is gradually changed from an old value to a new value by changing means 31 while values therebetween are interpolated by time-divisional processing.

In the detailed circuit to be described later, effect addition and changing of a tone color parameter are time-divisionally performed within a period (one sampling period) for which input signal data is sampled and written in the waveform data memory, resulting in a simple arrangement. Since the tone color parameter is gradually changed from an old value to a new value by changing means 31 while values therebetween are interpolated, generation of a discontinuous point in the waveform data memory can be prevented, and waveform data can be prevented from being discontinuously read out, resulting in no noise.

Detailed Circuit Arrangement

The circuit arrangement of an apparatus for adding a reverberation effect embodying the above-mentioned operation principle will be described with reference to FIG. 3 and FIGS. 12(*a*) and 12(*d*).

The circuit arrangement in the second embodiment is the same as that shown in FIG. 3 in the first embodiment described above. As will be decribed later, however, a control operation is different, and the internal arrangements of tone color parameter memories 16 and 17 are also different. The internal arrangements of tone color parameter memories 16 and 17 will be described with reference to FIGS. 12(*a*) and 12(*b*).

FIG. 12(*a*) shows the internal arrangement of tone color parameter memory 16. Output contents (RD1 to RD4) from first to fourth delay circuits before one sampling period are stored at addresses "0" to "3". A memory capacity FFFh (DW) of an area of waveform data memory 24 used for one delay circuit is stored at addresses "4" . Start addresses 0000 h (DS1), 1000 h (DS2), 2000 h (DS3), and 3000 H (DS4) of waveform data memory 24 used as first to fourth delay circuits are stored at addresses "5" to "8", respectively. Constant "0" (ZERO) is stored at address "9"; contance 0001 (ONE), address "10"; a content (MC) of a counter indicating an operation state upon changing of parameters, address "11"; and a content (WAVE) of input signal data × VOLI, address "12".

FIG. 12(*b*) shows the internal arrangement of tone color parameter memory 17. As tone color parameters, feedback multiplicators (g1 to g4) of the first to fourth delay circuits are stored at addresses "0" to "3"; delay times (t1 to t4) of the first to fourth delay circuits, addresses "4" to "7"; an input tone volume (VOLI), address "8"); an output tone volume (VOLO), address "9"; and contents (AD1 to AD4) of write address counters to the first to fourth delay circuits, addresses "10" to "13". At address "14", a content at one of addresses (0 to 7) of the tone color parameters is stored as (SEA), when the tone color parameter is gradually changed. A target value (SED) of a tone color parameter to be changed is stored at address "15", a content (SEC) of a counter for counting a change time of the tone color parameter, address "16"; an initial value (SEI) of the tone color parameter, address "17"; and a multiplicator (SEG) for determining a rate of change in tone color parameter, address "18". Note that each of the delay times (t1 to t4) indicates a difference between addresses on waveform data memory 24, i.e., between an address at which the present waveform is written and a read address from which the previously written waveform is read out. That is, the delay time indicates a value obtained by subtacting an original delay time from capacity (DW) of waveform data memory 24 used by one delay circuit.

Detailed Circuit Operation

The operation of the apparatus for adding the reverberation effect with the arrangement as shown in FIG. 3 and FIGS. 12(*a*) and 12(*b*) will be described below with reference to FIGS. 13, 14, 7, 9, and 10.

Figure 13:
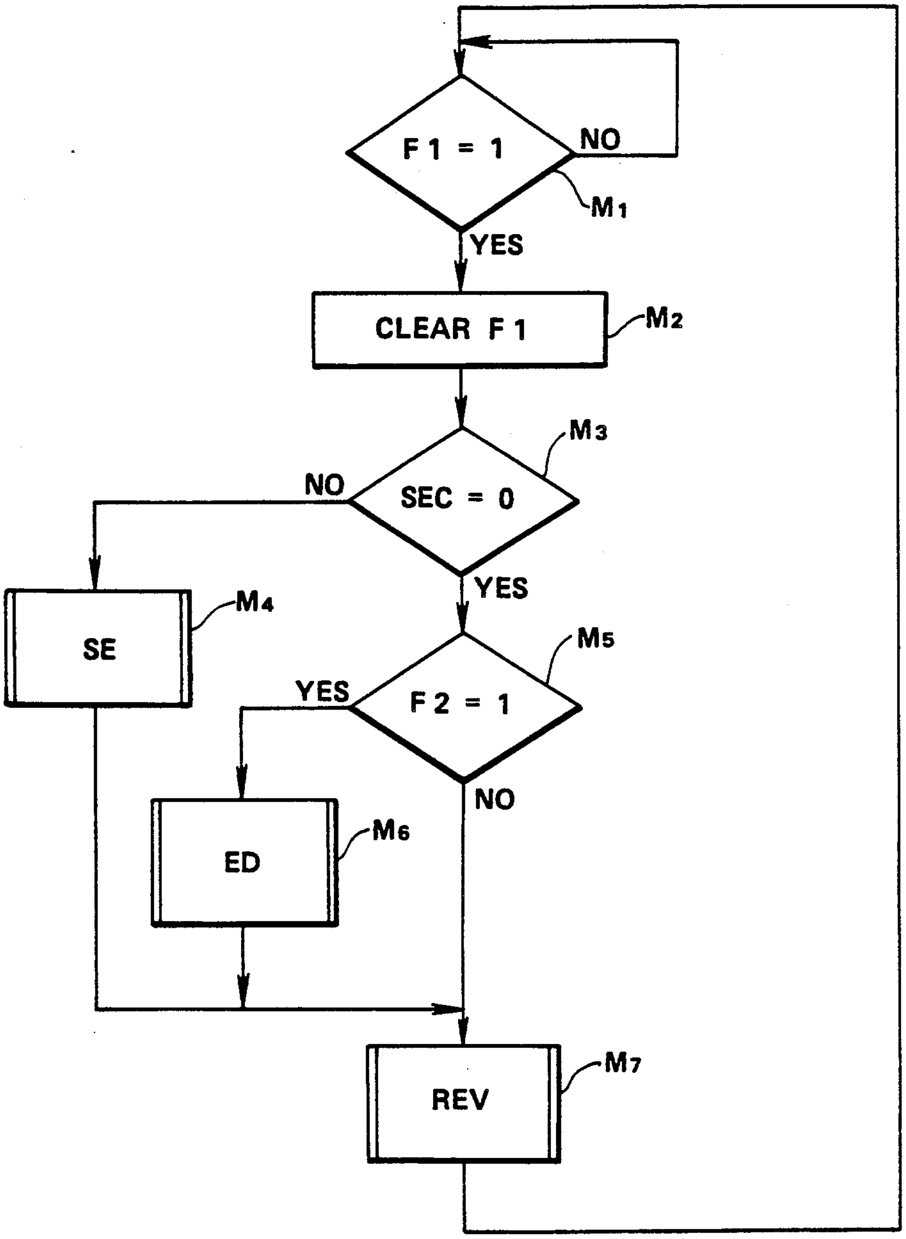
FIG. 13 is a flow chart showing the overall processing operation of the effect addition apparatus of the second embodiment.

The flow chart shown in FIG. 13 shows the overall processing operation of the apparatus for adding the reverberation effect shown in FIG. 3. It is checked in step M1 in FIG. 13 if a state (F1) of flip-flop 15 is "1". When F1=1 in response to the leading edge of external sampling clock CK1, signal F1 is supplied to controller 13. Thus, a count start signal is supplied from controller 13 to program counter 12. Program counter 12 starts incrementing a count in synchronism with clock signal CK2, and supplies an address to program memory 11. The content of program memory 11 is supplied to controller 13, thus controlling the respective sections. In step M2, a clear signal is supplied from controller 13 to flip-flop 15, thereby clearing flip-flop 15 (F1=0). It is then checked in step M3 if the content of (SEC) for counting a change time used when the tone color parameter is gradually changed is "0". The content of (SEC) becomes (SEC≠0) when the input/output tone volume is to be changed; otherwise, becomes (SEC=0 ). If NO in step M3, the flow advances to step M4 to execute block SE for gradually changing the tone color parameter (to be described later). However, if YES in step M3, the flow advances to step M5 to chech if a state (F2) of flip-flop 14 is "1". The state (F2) of flip-flop 14 is controlled by external signal PS, and becomes (F2=1) when a tone color parameter is fetched from an external circuit; otherwise, becomes (F2≠1). If YES in step M5, the flow advances to step M6 of executing block ED for fetching a tone color parameter from an external circuit, as will be described later. When tone color parameters (g1 to g4, t1 to t4) are to be changed, addresses "0" to "7" of tone color parameter memory 17 are set in tone color parameter address register 29 and changed values are set in tone color parameter data register 30 in response to an external input. If NO in step M5, the flow advances to step M7 of executing block REV for executing effect addition, as will be descirbed later. After block SE in step M4 and block ED in step M6 are completed, the flow advances to step M7 of executing block REV. After block REV is completed, the flow returns to step M1, and the same processing is repeated.

When a tone color parameter is not changed and only effect tone addition is executed, the content (SEC) of the counter for counting the change time of the tone color parameter becomes "0", and the state of flip-flop 14 is (F2=0). Therefore, processing in step M7 is repeated. In order to change the tone color parameter, data are respectively set in registers 29 and 30, and signal PS is applied to flip-flop 14. Thus, F2 becomes "1", and block ED (step M6) for fetching the tone color parameter is executed. In addition, block REV (step M7) is executed.

Figure 14:
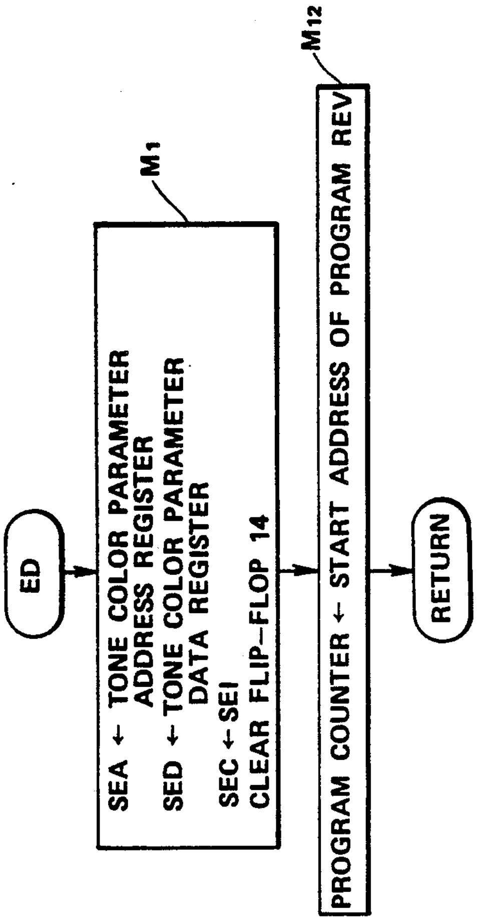
FIG. 14 is a flow chart showing a processing operation of block ED for fetching a tone color parameter in the second embodiment.

The flow chart shown in FIG. 14 shows the processing operation of block ED for fetching the tone color parameter. In step M11 in FIG. 14, one of addresses (0 to 7) of tone color parameters externally set in tone color parameter address register 29 is set in (SEA) (SEA←tone color parameter address register), data of the tone color parameter externally set in tone color parameter data register 30 is set in (SED) (SED←tone color parameter data register), and the value (SEI) of the counter for counting the change time is set in (SEC) (SEC←SEI). In the processing of step M11, in order to change the tone color parameter, the state of flip-flop 14 is cleared (F2=0) to be ready for fetching of a new externally set tone color parameter, initial setting, and changing of the next tone color parameter. Processing of gradually changing the tone color parameter is executed in block SE.

Processing in block SE is the same as the flow chart shown in FIG. 7 in the first embodiment. However, since data associated with a tone color parameter are set in (SEA) to (SEG), as described with reference to FIG. 12(*b*), the actual processing is processing of gradually changing the tone color parameter. More specifically, in step S31 in FIG. 7, "1" is subtracted from the value of (SEC) (SEC←SEC−ONE). In step S32, a value obtained by subtracting the value (SED) of the tone color parameter as a target to be attained from the tone color parameter of the address indicated by (SEA) is multiplied with the multiplicator (SEG) for determining the rate of change, and a value obtained by adding the product to the (SED) is set to be a tone color parameter at an address indicated by the (SEA) ([SEA]←SEG×([SEA]−SED)+SED). More specifically, in step S32, the rate multiplicator is multiplied with a difference between a tone of a previous tone color parameter and the value of a tone color parameter as a new target, thereby gradually changing the tone color parameter. In step S33, the start address of a program for executing processing of adding an effect is set in program counter 12. Thus, control enters block REV for adding an effect. The processing shown in FIG. 7 is repetitively executed until initial setting is performed in step M11 in the processing of FIG. 14 and the intitial value (SEI) set in (SEC) becomes "0 ". In this manner, a tone color parameter is gradually exponentially changed from a previous one to a new one.

The processing in block REV is the same as that in the flow chart of FIG. 9 in the first embodiment. The processing in block REV will be described below with reference to FIG. 9. When the tone color parameter is changed, block REV is executed in one sampling period after block SE for gradually changing the tone color parameter and block ED for fetching the tone color parameter. In step S51 in FIG. 9, the value of (VOLI) is multiplied with the value set in input register 27, and the product is set in (WAVE). More specifically, in FIG. 11, the arithmetic operation in step S51 is equivalent to multiplication of input signal data with the input tone volume (VOLI) by multiplier 2 in FIG. 11. In step S52, a value obtained by incrementing the content of (ADl) and (DW) are ANDed in units of bits, and a value obtained by ORing the AND result and (DS1) in units of bits is set in (AD1). Then, the content of (AD1) is set in address register 25 (AD1←((AD1+ONE) ∩ DW) ∪ DS1). More specifically, as shown in FIG. 10, in waveform data memory 24, when a value obtained by incrementing the content of (AD1) falls within the range of 1000 h to 1 FFFh, the incremented value becomes the content of (AD1). When the incremented value becomes 2000 h, start address 1000 h is set as the content of (AD1). For example, if the value obtained by incrementing the content of (AD1) is 1100 h, 0 FFFh and FFFh are ANDed in units of bits to yield 0100 h, and 0100 h and start address 1000 h are ORed to yield 1100 h as an initial value. When the value obtained by incrementing the content of (AD1) is 2000 h, 0 FFFh and FFFh are ANDed in units of bits to yield 0000 h, and 0000 h and 1000 h are ORed to yield 1000 h. In step S53, a value obtained such that a value obtained by multiplying (RD1) with g1 is added to (WAVE) is set in data register 26. The value in data register 26 is written at an address of waveform data memory 24 indicated by address register 25. More specifically, a value obtained by multiplying the output from the first delay circuit in the immediately preceding sampling period with feedback multiplicator g1 is added to a value obtained by multiplying the input signal with (VOLI), and the product is written in the first delay circuit. In step S54 in FIG. 9, (DW) and a value obtained by adding the content of (AD1) to t1 are ANDed in units of bits, and the AND result and (DS1) are ORed. The OR result is set in address register 25 (address register←(AD1+t1) ∩ DW ∪ DS1). The logic arithmetic operation in step S54 is to perform the same processing as in step S52. In step S54, addressing is made to read out waveform data in an area incremented by an address corresponding to t1. In the second embodiment, the value of (DW−t1) corresponds to an original delay time. As can be seen from FIG. 10, waveform data stored at an address after t1 is previous waveform data of (DW−t1). In step S55, a value read out from the addrewss of waveform data memory 24 indicated by address register 25 and set in data register 26 is stored in (RD1) (RD1←data register).

In steps S56, S57, and S58, the same processing as in steps S52 to S55 is repeated for the second to fourth delay circuits. In step S59, a value obtained by multiplying a total value of (RD1) to (RD4) with (VOLO) is added to the value in input register 27, and the sum is stored in output register 28. The sum is then output to the external circuit. More specifically, the above arithmetic operations correspond to the following ones. That is, in FIGS. 11 and 2, the outputs from delay circuits 1-1 to 1-4 are totaled by adder 1-13, and the total value is multiplied with (VOLO) of multiplier 3, and the product is added to the input signal data by adder 4.

As described above, arithmetic processing for adding a reverberation effect is time-divisionally performed within one sampling time in units of the first to fourth delay circuits, thus obtaining a reverberation effect tone. In addition, the tone color parameter can be gradually changed from an old value to a new value while being interpolated. Therefore, a reverberation effect tone addition circuit and a special circuit for changing the tone color parameter can be omitted, resulting in a simple arrangement.

Since the tone color parameter is gradually changed, noise due to a discontinuous point on waveform data in waveform data memory 24 or discontinuous reading out of wavefrom data can be prevented.

The apparatus in the second embodiment can be applied to various other effect addition apparatuses for adding various effects such as echo, chorus, and the like, using delay circuits, as well as a reverberation effect addition apparatus. In the second embodiment, the tone color parameter is exponentially changed, but may be changed in one step. In addition, an old value may be linearly changed to a new value. A change speed of the tone color parameter can be arbitrarily set. In the second embodiment, one tone color parameter is changed. However, address and data registers for a plurality of tone color parameters may be provided so as to process the parameters at the same time. The number of delay circuits and the capacity of the waveform data memory can be arbitrarily set, and are not limited to those in the second embodiment.

Third Embodiment

A third embodiment of an effect addition apparatus according to the present invention will be described hereinafter with reference to FIGS. 15 and 26. The apparatus in the third embodiment is an apparatus for obtaining a stereophonic output added with effects.

Schematic Description of Operation using Principle Block Diagram

The operation principle of the apparatus according to the third embodiment will be described with reference to FIGS. 15 to 18.

Figure 15:
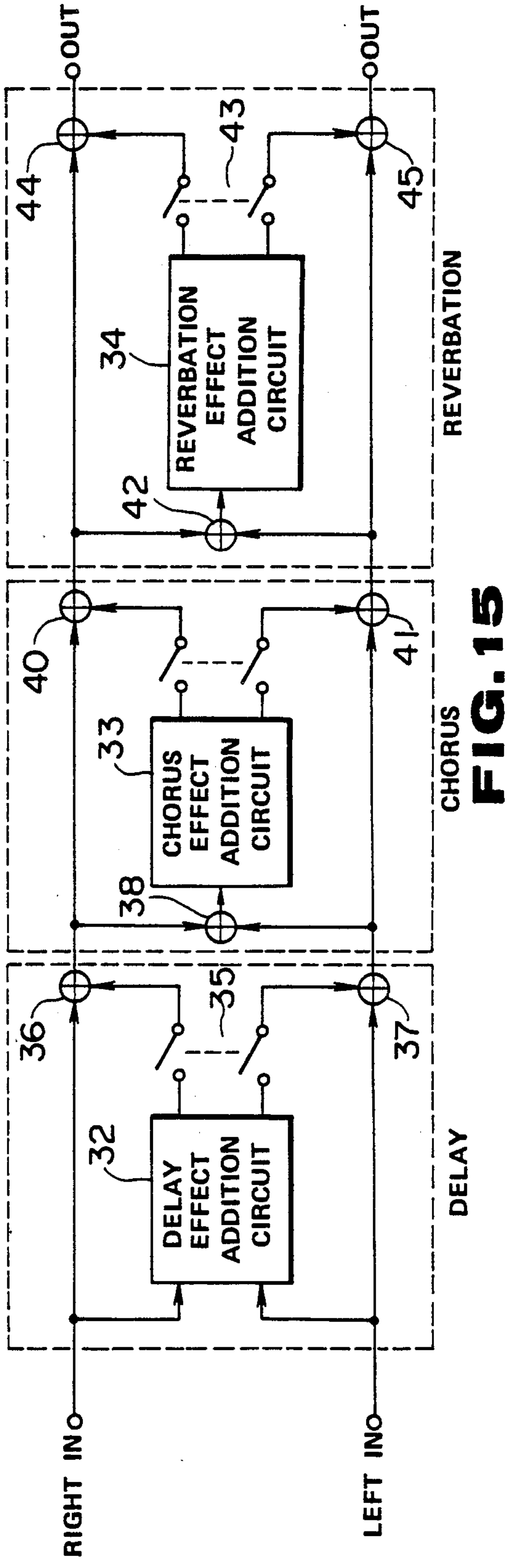
FIG. 15 is a functional block diagram showing an effect addition apparatus according to a third embodiment of the present invention.

In the functional block diagram shown in FIG. 15, in order to add an effect tone to an original musical tone signal, the apparatus had delay effect addition circuit 32, chorus effect addition circuit 33, and reverberation effect addition circuit 34. In a detailed circuit to be described later, effect addition processing for each of delay, chorus, and reverberation effects is time-divisionally performed for every sampling period in a stereophonic state. Stereophonic right and left input signals are input to the right and left input terminals of delay effect addition circuit 32 to be added with a delay effect, and the obtained signals are output from the right and left output terminals. The right and left outputs from addition circuits 32 are respectively supplied to adders 36 and 37 through delay effect selection switches 35. Adders 36 and 37 respectively add the right and left ouputs from addition circuit 32 to the right and left input signals. The outputs from adders 36 and 37 are added by adder 38, and the sum output is input terminal of chorus effect addition circuit 33 to be added with a chorus effect. The data is then output from the right and left output terminals. The right and left outputs from addition circuit 33 are supplied to adders 40 and 41 through chorus effect selection switches 39 which are simultaneously switched. Adders 40 and 41 respectively add the right and left outputs from addition circuit 33 to the outputs from adders 36 and 37. The outputs from adders 40 and 41 are added by adder 42. The sum output is input to the input terminal of one-input reverberation effect addition circuit 34 to be added with a reverberation effect, and is output from the right and left output terminals. The right and left outputs from addition circuit 34 are respectively supplied to adders 44 and 45 through reverberation effect selection switches 43 which are simultaneously switched. Adders 44 and 45 respectively add the right and left outputs from addition circuit 34 to the outputs from adders 40 and 41, and output the sums from the right and left output terminals.

Figure 16:
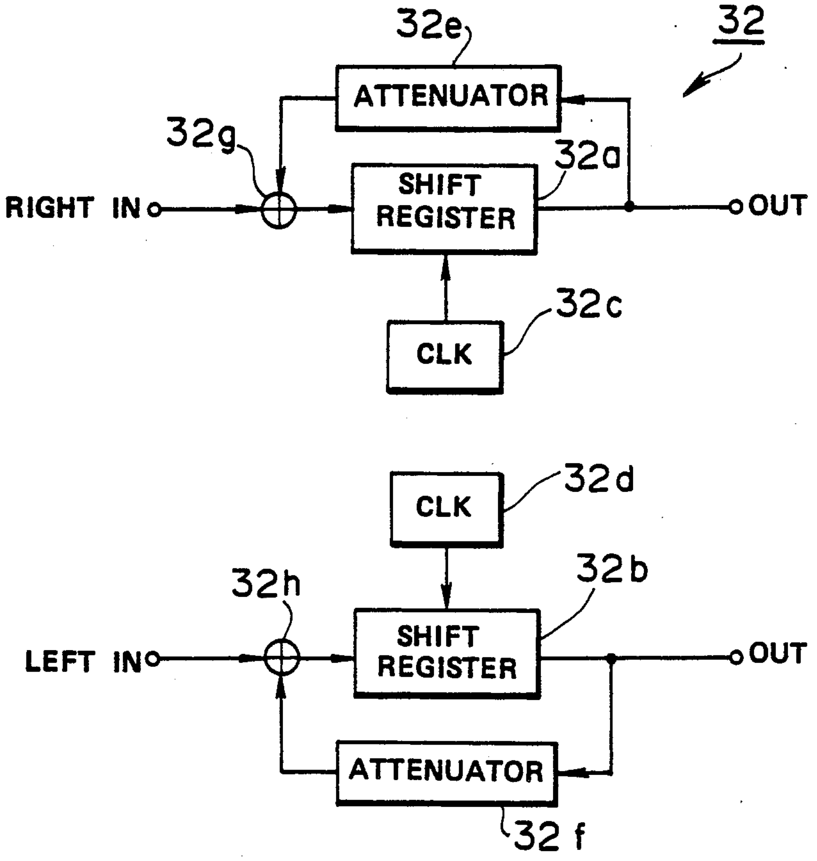
FIG. 16 is a functional block diagram showing a delay effect addition ciruit shown in FIG. 15.

FIG. 16 is a functional block diagram showing an arrangement of delay effect addition circuits 32 shown in FIG. 15. In FIG. 16, the circuit for adding the delay effect includes two independent systems for right and left input signals, and is constituted by shift registers 32*a* and 32*b* constituting a delay circuit, clock generators (CLKs) 32*c* and 32*d* for respectively shifting the contents of shift registers 32*a* and 32*b*, attenuators 32*e* and 32*f* for respectively attenuating the outputs from shift registers 32*a* and 32*b* and feeding back the attenuated outputs to the input sides, and adders 32*g* and 32*h*, connected to the input terminals of shift registers 32*a* and 32*b*, for respectively adding the input signals to the outputs from attenuators 32*e* and 32*f*. The output terminals of shift registers 32*a* and 32*b* are respectively connected to delay effect output terminals. More specifically, input signals are delayed by shift registers 32*a* and 32*b* having feedback loops, and are added with a predetermined delay effect to be stereophonically output. In a detailed circuit to be described later, shift times of shift registers 32*a* and 32*b* mean delay times of the delay effect, and attenuation amounts of attenuators mean freedback amounts of the delay effect.

Figure 17:
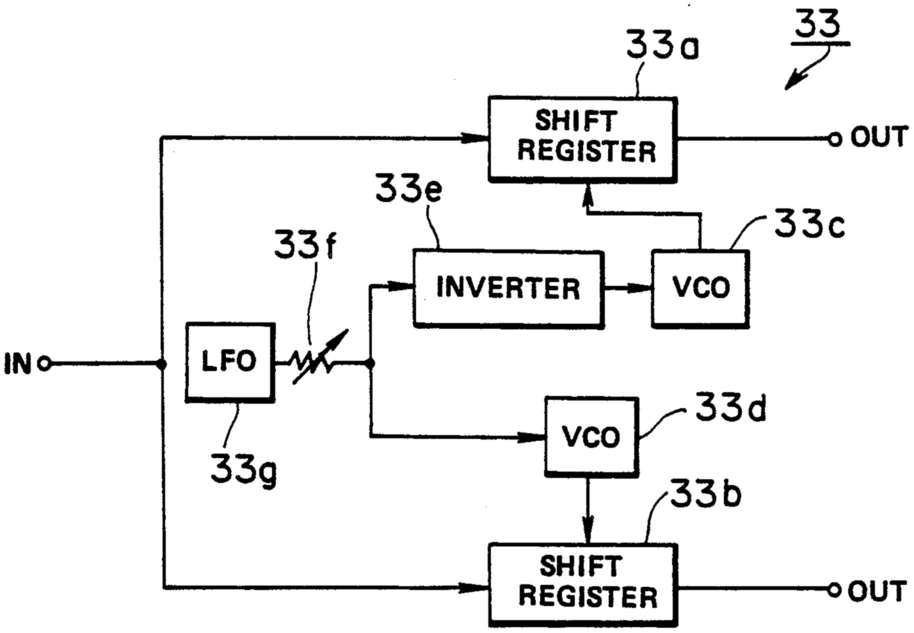
FIG. 17 is a functional block diagram showing a chorus effect addition ciruit shown in FIG. 15.

FIG. 17 is a functional block diagram showing an arrangement of chorus effect addition circuit 33. In FIG. 17, chorus effect addition circuit 33 has shift registers 33*a* and 33*b* constituting two, i.e., right and left output delay circuits having a common input, and voltage controlled oscillators (VCOs) 33*c* and 33*d* for respectively supplying modulation frequencies to shift registers 33*a* and 33*b*.

VCO 33*c* is connected to phase inverter 33*e*. Phase inverter 33*e* and the other VCO 33*d* are connected to low-frequency oscillator (LFO) 33*g* through volume 33*f*. The output terminals of shift registers 33*a* and 33*b* are respectively connected to chorus effect output terminals. A low-frequency output generated from LFO 33*g* is supplied to VCO 33*c* through inverter 33*e*, and directly to VCO 33*d*. Therefore, the oscillation frequencies of VCOs 33*c* and 33*d* are periodically changed, so that a frequency modulation effect is added and the outputs are stereopohonically generated. Note that in a detailed circuit to be described later, a low-frequency output and a waveform readout signal are obtained not by voltage control but by digital arithmetic control.

Figure 18:
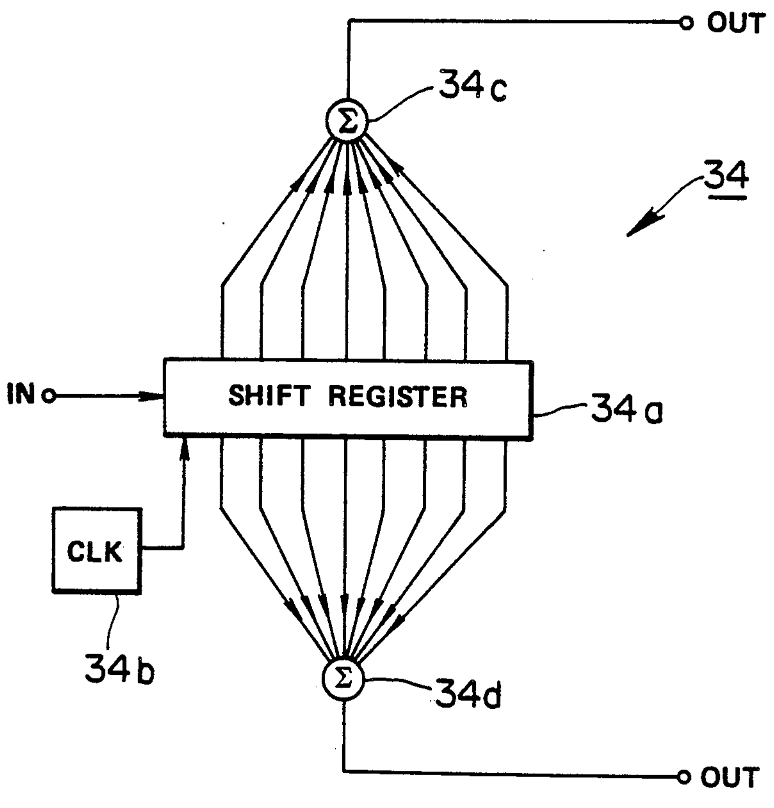
FIG. 18 is a functional block diagram showing a reverberation effect addition circuit shown in FIG. 15.

FIG. 18 is a functional block diagram showing an arrangement of reverberation effect addition circuit 34 shown in FIG. 15. In FIG. 18, reverberation effect addition circuit 34 comprises shift register 34*a*, clock generator (CLK) 34*b* for shifting shift register 34*a*, and adders 34*c* and 34*d* for adding a plurality of intermediate tap outputs from shift register 34*a* to generate right and left outputs. The output terminals of adders 34*c* and 34*d* are respectively connected to reverberation effect output terminals. More specifically, the input signal is various delayed at the intermediate taps of shift register 43*a*, and the delayed outputs are added by adders 34*c* and 34*d* to be added with a reverberation effect. Thus, the obtained signals are stereophonically output.

The operation of the apparatus shown in FIGS. 15 to 18 will be described below.

For example, assume that reverberation effect selection switch 34 is OFF, and delay and chorus effect selection switches 35 and 39 are ON. Signals input to the two input terminals are added with the delay effect by delay effect addition circuit 32, and are stereopohonically output. The outputs with the delay effect are added to the input signals by adders 36 and 37.

The outputs from adders 36 and 37 are added by adder 38, and the sum is input to chorus effect addition circuit 33. The signal is added with the chorus effect and is stereophonically output. The outputs with the chorus effect and the outputs from adders 36 and 37 are added by adders 40 and 41, respectively. The outputs from adders 40 and 41 are ones obtained by adding delay and chorus effects to signals input from the input terminals. Since reverberation effect selection switch 34 is OFF, adders 44 and 45 receive only outputs from adders 40 and 41. Therefore, adders 44 and 45 stereophonically output the signals with the delay and chorus effects since the corresponding selection switches are ON.

The same operation as described above is performed when other selection switches are ON. More specifically, in the above arrangement, when at least one effect selection switch is ON, stereophonic outputs with the selected effect can appear at the final output terminals.

Detailed Circuit Arrangement

The circuit arrangement of an effect addition apparatus for obtaining stereophonic outputs, which embodies the operation principle described above will be described with reference to FIG. 19 and FIGS. 20(*a*) and 20(*b*).

Figure 19:
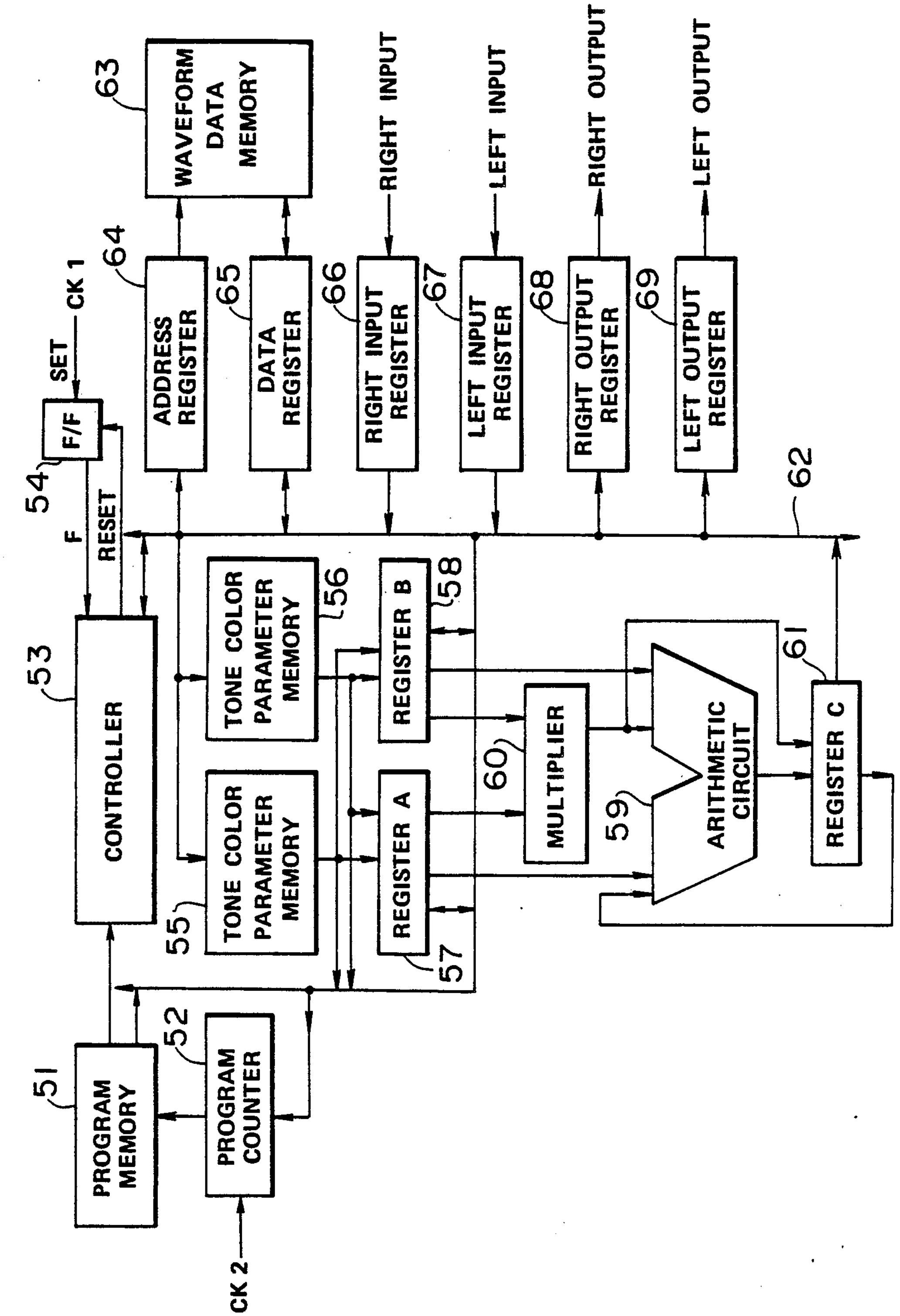
FIG. 19 is a block diagram showing a detailed arrangement of an effect addition apparatus which time-divisionally performs effect addition according to the third, fourth, and fifth embodiments of the present invention.

FIG. 19 is a block diagram showing a detailed arrangement of an apparatus which time-divisionally performs processing of adding an effect. The apparatus shown in FIG. 19 realizes the same functions as the principle circuits shown in FIGS. 15 and 18. The circuit shown in FIG. 19 is constituted by an integrated signal processor.

In FIG. 19, program memory 51 stores predetermined programs, and receives, as an address, an output from program counter 52, which is incremented by clock signal CK2 supplied from a clock generator (not shown). An addressed program is supplied to controller 53. Controller 53 controls data transfer between registers and memories (to be described later), various arithmetic operations, and address data supply timing to program counter 52, and the like, in accordance with the content of the program supplied from program memory 51. Flip-flop 54 is set in response to external sampling clock CK1, and supplies set signal F to controller 53. Controller 53 supplies a reset signal to flip-flop 54. Note that clock signal CK2 supplied to program counter 52 is sufficiently shorter than external sampling clock CK1 supplied to flip-flop 54.

Tone color parameter memories 55 and 56 store tone color parameters for adding delay, chorus, and reverberation effects, constants used in arithmetic operations, and some of waveform data, as will be described in detail later with reference to FIGS. 20(*a*) and 20(*b*).

Registers A 57 and B 58 output data to arithmetic circuit 59 which receives data from tone color parameter memories 55 and 56 or registers (to be described later), and performs addition/subtraction, and to multiplier 60. Arithmetic operation results from arithmetic circuit 59 and multiplier 60 are supplied to register C 61, and the output from register C 61 is supplied to respective sections through internal bus 62.

Waveform data memory 63 stores waveform data, and receives write and read addresses from address register 64. Data to be written in or read out from waveform data memory 63 is stored in data register 65.

Note that memory 63 comprises a RAM, and functionally corresponds to shift registers constituting delay circuits in delay, chorus, and reverberation effect addition circuits 32, 33, and 34 shown in FIG. 15. Data register 65 performs data transfer through internal bus 62. Right and left input registers 66 and 67 are used for right and left inputs of stereophonic digital input signals. Right and left output registers 68 and 69 are used for right and left outputs, respectively.

The output signal data from right and left output registers 68 and 69 go through a digital-to-analog converter, a low-pass filter, an output amplifier, and the like, thus producing stereophonic outputs added with effects.

Internal arrangements of tone color parameter memories 55 and 56 will be described below with reference to FIGS. 20(*a*) and 20(*b*).

FIG. 20(*a*) shows the internal arrangement of tone color parameter memory 55 shown in FIG. 19. Addresses "0" to "3n" are assigned to an area, used by the LFO, for storing parameter contents for the LFO such as time data, angle data, change amount data of an angle, and the like. Input pointers (DPOINTR and DPOINTL) for the right- and left-channel delay memories are respectively stored at addresses "3n+1" and "3n+2". Sizes (DERIAAR and DERIAAL) of areas used by right- and left-channel delay memories are respectively stored at addresses "3n+3" and "3n+4", and start addresses (DERIAOR and DERIAOL) of areas used by the right- and left-channel delay memories are stored at addresses "3n+5" and "3n+6". An input pointer (CPOINT) of a chorus memory is stored at address "3n+7"; a size (CERIAA) of an area used by the chorus memory, address "3n+8"; and a start address (CERIAO) of an area used by the chorus memory, address "3n+9". An input pointer (RPOINT) of a reverberation memory is stored at address "3n+10"; a size (RERIAA) of an area used by the reverberation memory, address "3n+11"; and a start address (RERIAO) of an area used by the reverberation memory, address "3n+12". Right- and left-channel delay feedback waveform data (DRDATAR and DRDATL) are respectively stored at addreses "3n+13" and "3n+14"; right- and left-channel waveform data (WAVER and WAVEL), addresses "3n+15" and "3n+16"; and effect tone waveform data (EWAVER and EWAVEL), addresses "3n+17" and "3n+18".

FIG. 20(*b*) shows the internal arrangement of tone color parameter memory 56 shown in FIG. 19. Addresses "0" to "11" are used as an area used by the LFO corresponding to the content of an arbitrary waveform for low-frequency oscillation. Right- and left-channel delay effect delay times (DTIMER and DTIMEL) are respectively stored at addresses "12" and "13". The delay times of the delay effect respectively correspond to the shift times of shift registers 32*a* and 32*b* shown in FIG. 16 described above. Right- and left-channel delay effect feedback amounts (DRPEATR and DRPEATL) are respectively stored at addresses "14" and "15". The feedback amounts respectively correspond to the attenuation amounts of attenuators 32*e* and 32*f* shown in FIG. 16. Right- and left-channel delay effect depths (DDEPTHR and DDEPTL) are respectively stored at addresses "16" and "17". A chorus effect depth (CDEPTH) is stored at address "18", and a chorus effect delay time (CDTIME) is stored at address "19". The chorus effect delay time corresponds to the shift times of shift registers 33*a* and 33*b* shown in FIG. 17. Right-channel reverberation effect delay times (DT1R to DTmR) are stored at addresses "20" to "20+m", respectively. The delay times correspond to the shift times at the respective intermediate taps of shift register 34*a* shown in FIG. 18. Left-channel reverberation effect delay times (DT1L to DTmL) are respectively stored at addresses "21+m" to 21+2m", and a reverberation effect depth (RDEPTH) is stored at address "22+2m". Note that an actual delay time is different from the delay times by the shift registers and the like shown in FIGS. 16 to 18, and indicates a difference between addresses on waveform data memory 63, i.e., a difference between an address at which a present waveform is written waveform is read out. That is, the actual delay time indicates a value obtained by subtracting an original delay time from the size of an area of waveform data memory 63 used by one memory.

Detailed Circuit Operation

The operation of the effect addition apparatus shown in FIG. 19 with the above arrangement will be described below in detail with reference to FIGS. 21 to 25.

Figure 21:
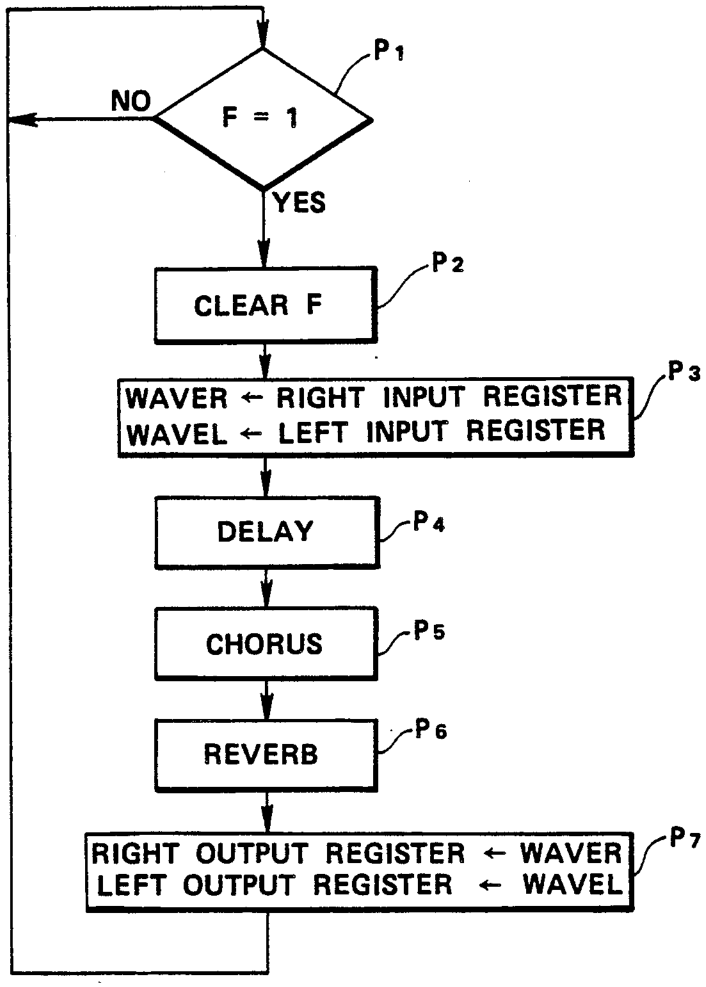
FIG. 21 is a flow chart showing the overall process operation of an effect addition apparatus according to the third embodiment.

The flow chart shown in FIG. 21 shows the overall processing operation of the effect addition apparatus. It is checked in step P1 in FIG. 21 if a state (F) of flip-flop 54 is "1". That is, if F=1, signal F is supplied to controller 53, and a count start signal is supplied from controller 53 to program counter 52. Program counter 52 starts incrementing of a count in synchronism with clock signal CK2, and supplies an address to program memory 51. The content of program memory 51 is supplied to controller 53, thereby controlling the respective sections. In step P2, a reset signal is supplied from controller 53 to flip-flop 54 to reset flip-flop 54 (F=0). In step P3, the values in right and left input registers 66 and 67 are respectively written in (WAVER) and (WAVEL). In steps P4 to P6, delay effect addition processing (DELAY), chorus effect addition processing (CHORUS), and reverberation effect addition processing (REVERB) (to be described later) are sequentially executed. When only pre-selected effect addition is to be executed, selected one of processing operations in steps P4 to P6 is executed, and the remaining steps are not executed. This is equivalent to the functions of switches 35, 39, and 43 shown in FIG. 15. In step P7, (WAVER) and (WAVEL) are respectively transferred to right and left output registers 68 and 69. This operation corresponds to the following operation. That is, effects are added in inpout signals by delay, chorus, and reverberation effect addition circuits 32, 33, and 34 in FIG. 15, and stereophonic outputs are obtained from the output terminals.

Figure 22:
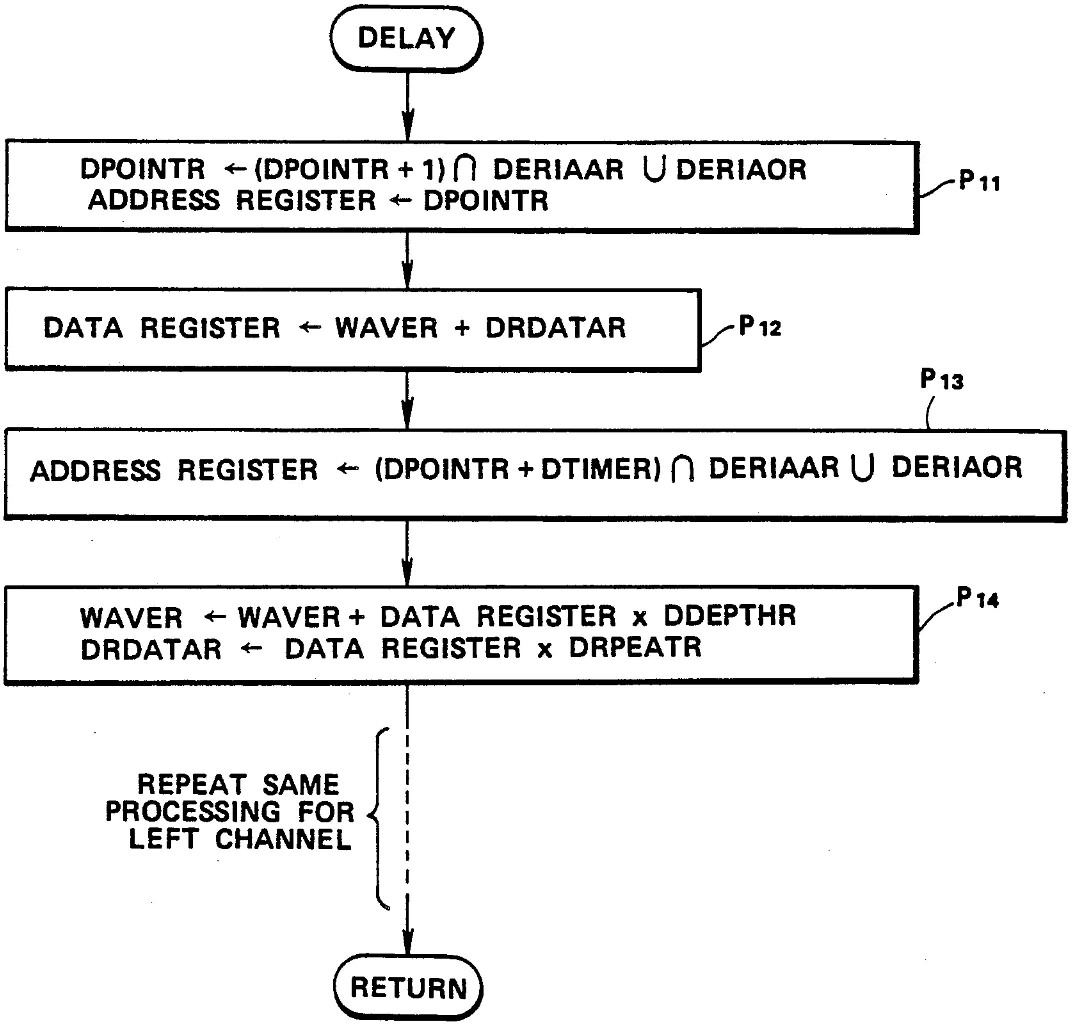
FIG. 22 is a flow chart showing a delay effect addition processing operation.

The flow chart shown in FIG. 22 shows in detail the processing operation of adding a delay effect in step P4 in FIG. 21. In step P11 in FIG. 22, a value obtained by incrementing (DPOINTR) and (DEIAAR) are ANDed, and a value obtained byORing the AND result and (DERIAOR) is stored in (DPOINTR) (DPOINTR←(DPOINTR+1) ∩ DERIAAR ∪ DERIAOR). In addition, the content of (DPOINTR) is set in address register 64 (address register←DPOINTR). More specifically, in the logic arithmetic operation in step P11, when a value obtained by incrementing (DPOINTR) falls within the area used by the delay memory, the incremented value becomes the content of (DPOINTR). When the incremented value exceeds the end address of the delay memory, a value of the start address becomes the content of (DPOINTR). In step P12, a value obtained by adding (WAVER) and (DRATAR) is set in data register 65. The value in register 65 is written at an address of waveform data memory 63 indicated by address of waveform data memory 63 indicated by address register 64. This processing corresponds to the arithmetic operation wherein the output from shift register 32*a* is attenuated by attenuator 32*e*, the attenuated value and the input data are added by adder 32*g*, and the sum is written in shift register 32*a*, as shown in FIG. 16. In step P13 in FIG. 22, (DERIAAR) and a sum of (DPOINTR) and (DTIMER) are ANDed, and a value obtained by ORing the AND result and (DERIAOR) is set in address register 64 (address register←(DPOINTR+DTIMER) ← DERIARR ∪ DERIAOR). The logic arithmetic operation in step P13 is to perform the same processing as in step P11, and asddressing is performed to read out waveform data in an area of the delay memory at an address incremented by an address corresponding to (DTIMER). Note that a value (DERIAAR-DTIMER) corresponds to an original delay time. More specifically, in the delay memory, waveform data stored at an address corresponding to a sum of a present address value and an address value of (DTIMER) is one stored at a previous address an address value (DRIAAR-DTIMER) past the present address. In step P14, a sum of (WAVER) and a value obtained by multiplying the value in data register 65 with (DDEPTHR) is stored in (WAVER), and a value obtained by multiplying the value in data register 65 with (DRPEATR) is stored in (DRDATAR) (WAVER←WAVER+data register×DDEPTHR, DRDATAR←data register×DPEATT). More specifically, by the processing in step P13, waveform data stored at an address of waveform data memory 63 designated by address register 64 is read out, thus obtaining a right-channel delay effect tone.

The same processing as in steps P11 to P14 is performed for the left channel, thus obtaining a left-channel delay effect tone.

Figure 23:
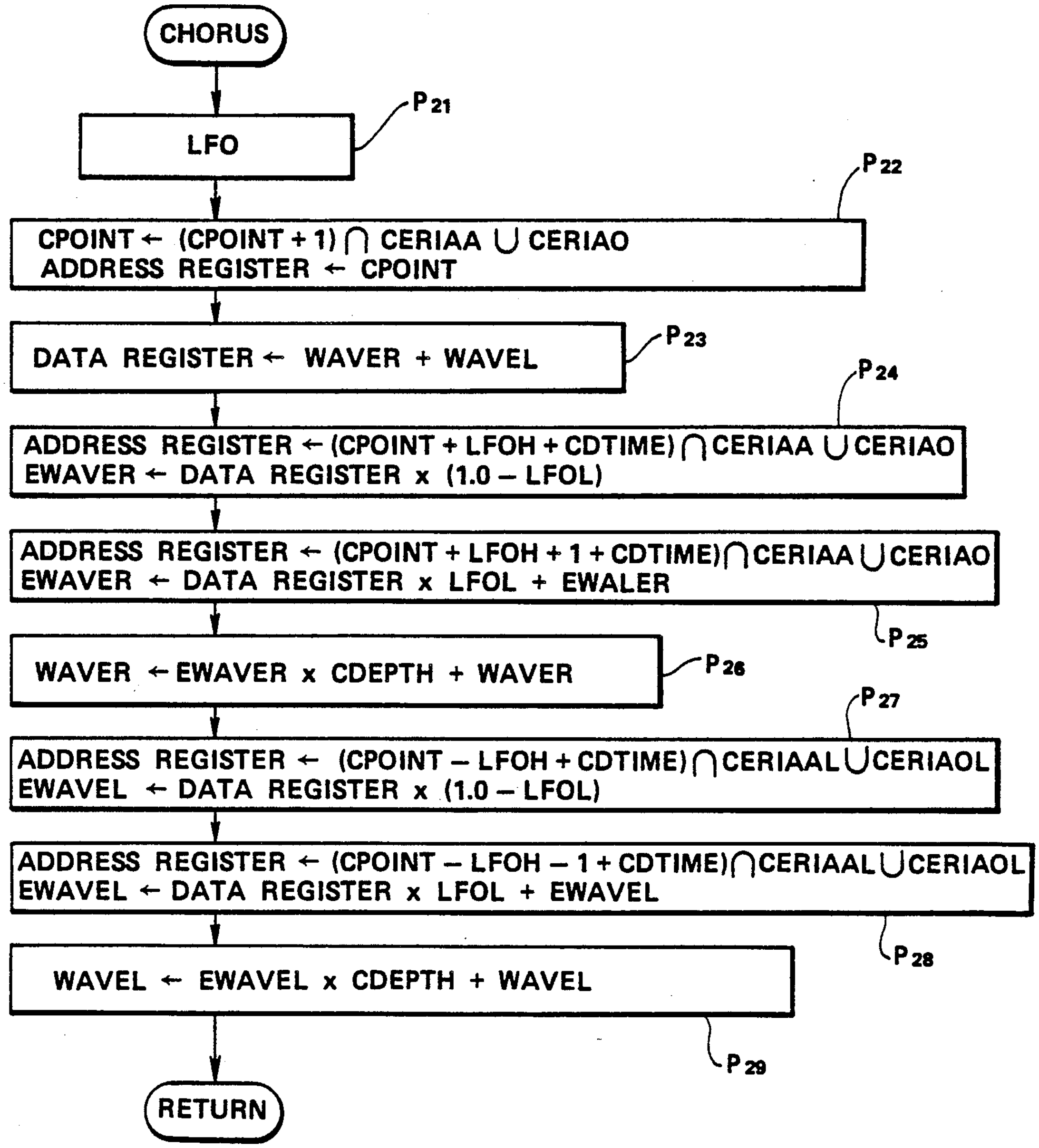
FIG. 23 is a flow chart showing a chorus effect addition processing operation.

The flow chart shown in FIG. 23 shows in detail the processing operation for adding a chorus effect in step P5 in FIG. 21. In step P21 in FIG. 23, processing of the LFO for obtaining low-frequency waveform data is performed. To summarize the processing in step P21, a waveform to be generated is stored in the form of time data, angle data, and change amount data of an angle, and a readout speed is changed by a counting means and an accumulation means so as to output an integral part output (LFOH) and a decimal part output (LFOL) of the waveform. A wqaveform free from distortion can be generated in accordance with a frequency, and the decimal part output (LFOL) with a constant change amount can be easily obtained. More specifically, after the processing in step P21, integral and decimal part output (LFOH and LFOL) of low-frequency waveform data to be generated can be obtained.

In step P22, (CERIAA) and a value obtained by incrementing (CPOINT) are ANDed, and a value obtained by ORing the AND result and (CERIAO) is written in (CPOINT) (CPOINT←CPOINT+1) ∩ CERIAA ∪ CERIAO). In addition, the content of (CPIONT) is set in addres register 64 (address register←CPOINT). More specifically, when the value obtained by incrementing (CPOINT) falls within an area used by the chorus memory, the incremented value becomes the content of (CPOINT). When the incremented value exceeds the end address of the memory, a value of the start address becomes the content of (CPOINT). In step P23, a sum of (WAVER) and (WAVEL) is set in data register 65. Then, the value of data register 65 is written at an address of waveform data memory 63 indicated by address register 64. This processing corresponds to the processing in FIG. 15 wherein the outputs from adders 36 and 37 are added by adder 38, and the sum is written in chorus effect addition circuit 33. In step P24, (CERIAA) and a sum of (CPOINT), (LFOH), and (CDTIME) are ANDed, and a value obtained by ORing the AND result and (CERIAO) is stored in address register 64 (address register←(CPOINT+LFOH+CDTIME) ∩ CERIAA ∪ CERIAO). The value in data register 65 is multiplied with a value obtained by subtracting (LFOL) from 1.0, and the product is stored in (EWAVER) (EWAVER data register×(1.0−LFOL).

Figure 25:
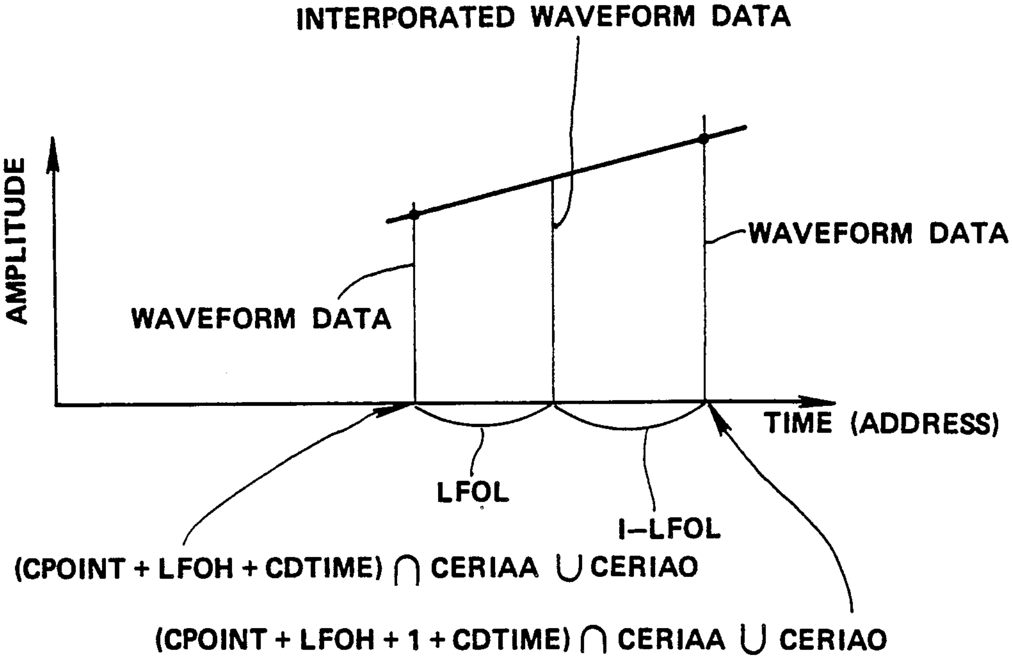
FIG. 25 is a view for explaining chorus effect arithmetic processing.

In step P25, (CERIAA) and a sum of (CPOINT), (LFOH), "1", and (CDTIME) are ANDed, and a value obtained by ORing the AND result and (CERIAO) is set in address register 64 (address register←(CPOINT+LFOH+1+CDTIME) ∩ (CRIAA ∪ CERIAO). A sum of (EWAVER) and a value obtained by multiplying the value in data register 65 with (LFOL) is stored in (EWAVER) (EWAVER←data register×LFOL+EWAVER). More specifically, by the logic arithmetic operations in steps P24 and P25, addressing is performed to read out waverform data at an address value corresponding to a sum of (LFOH) and (CDTIME) and at an address corresponding to a value obtained by adding 1 to the address value in the chorus memory. As shown in FIG. 25, an arithmetic operation is performed to linearly interpolate waveform data stored at adjacent addresses of the waveform data memory to obtain a value corresponding to the decimal part (LFOL).

In step P26, a value obtained by multiplying (EWAVER) with (CDEPTH) is added to (EWAVER), and the sum is stored in (WAVER). Therefore, in steps P24 to P26, a read address is periodically changed in correspondence with a lows-frequency waveform generated as the LFO, thereby changing a delay time so as to output waveform data. Thus, a right-channel chorus effect tone is obtained.

In steps P27 and P28, addressing is performed to read out waveform data stored at an address obtained by (CPOINT−LFOH+CDTIME) and at an address corresponding to a value obtained by subtracting 1 from this address value in the chorus memory, as in steps P24 and P25. Then, an arithmetic iperation is performed to linearly interpolate waveform data stored at adjacent addresses of he waveform data memory to obtain a value corresponding to the decimal part (LFOL). More specifically, in steps P27 and P28, an address of waveform data memory 63 corresponding to a value obtained by inverting an output from the LFO is designated to read out waveform data, and thereafter, the interpolation arithmetic operation is similarly performed. These operations correspond to the following operations. That is, in FIG. 17, the output from LFO 33*g* is supplied to shift register 33*a* through inverter 33*e* and VCO 33*c*, and to shift register 33*b* through VCO 33*d*, and data in shift registers 33*a* and 33*b* are read out by changing the delay times. In step P29, a value obtained by multiplying (EWAVEL) with (CDEPTH) is added to (WAVEL), and the sum is stored in (WAVEL). Therefore, by the processing in steps P27 to P29, a read address of waveform data memory 63 is changed in correspondence with the low-frequency waveform of the LFO, thereby changing the delay time so as to output waveform data. Thus, a left-channel chorus effect tone can be obtained.

Figure 24:
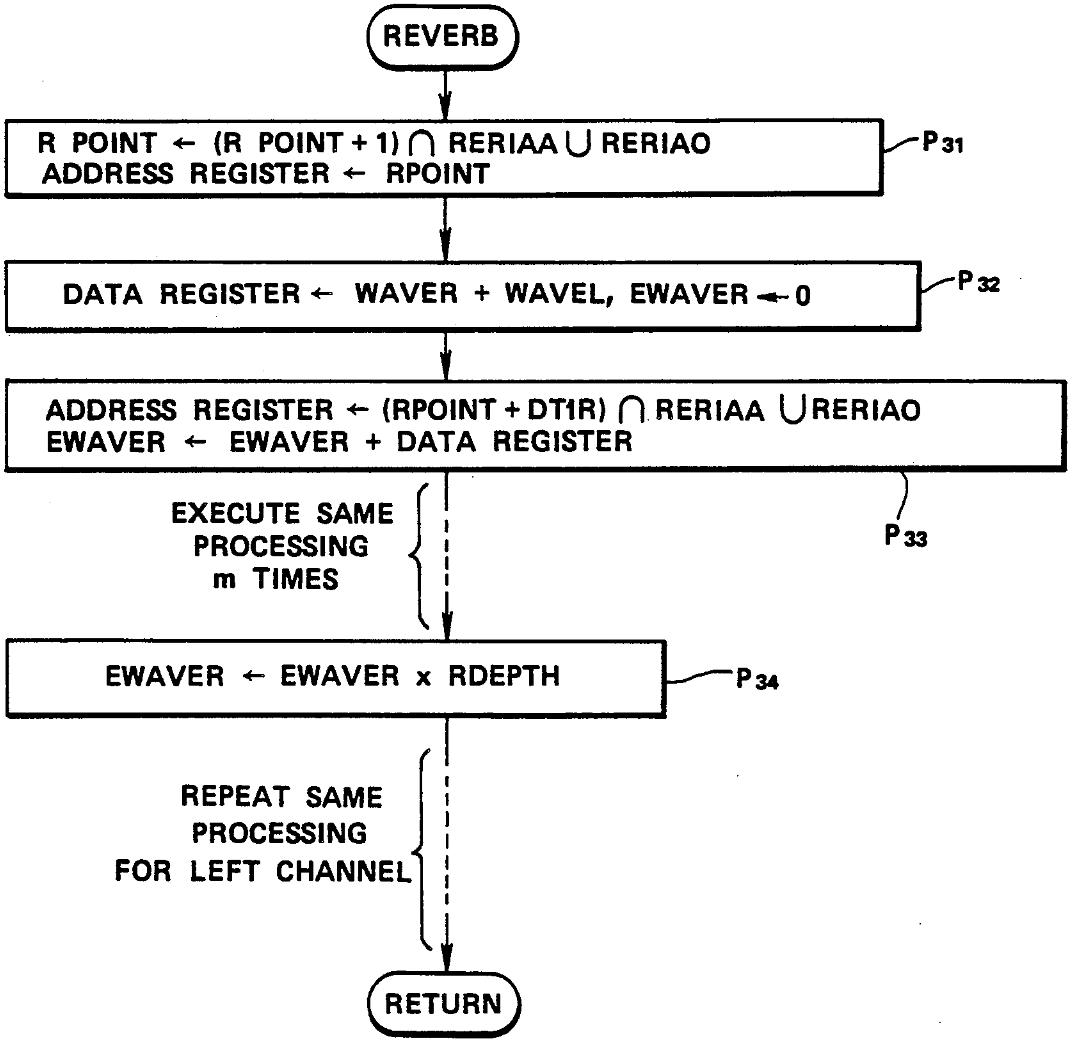
FIG. 24 is a flow chart showing a reverberation effect addition processing operation.

The flow chart shown in FIG. 24 shows in detail the processing operation for adding the reverberation effect in step P6 in FIG. 21. In step P31 in FIG. 24, (RERIAA) and a value obtained by incrementing (RPOINT) are ANDed, and a value obtained by ORing the AND result and (RERIAO) is stored in (RPOINT) (RPOINT←(RPOINT+1) ∩ RERIAA ∪ RERIAO). The content of (RPOINT) is then stored in address register 34 (address register RPOINT). More specifically, when the value obtained by incrementing (RPOINT) falls within the area used by the reverberation memory, the incremented value becomes the content of (RPOINT). When the incremented value exceeds the end address of the memory, a value of the start address becomes the content of (RPOINT). In step P32, "0" is stored in (EWAVER), and a sum of (WAVER) and (WAVEL) is transferred to data register 65. This operation corresponds to the processing in FIG. 15, wherein the outputs from adders 40 and 41 are added by adder 42, and the sum is supplied to reverberation effect addition circuit 34. The value stored in data register 65 is written at an address of waveform data memory 63 designated by address register 64. In step P33, (RERIAA) and a sum of (RPOINT) and (DT1R) are ANDed, and a value obtained by ORing the AND result and (RERIAO) is stored in address register 64 (address register←(RPOINT+DT1R)∩ RERIAA∪ RERIAO). The sum of the value in data register 65 and (EWAVER) is stored in (EWAVER) (EWAVER←EWAVER+data register). More specifically, in the logic arithmetic operation in step P33, addressing is performed to read out waveform data stored at an address incremented by an address value corresponding to the delay time (DT1R) with respect to (RPOINT) in the reverberation memory. The addressed waveform data is read out and stored in data register 65. In the same manner as in step P33, reverberation effect waveform data stored at addresses incremented by address values corresponding to delay times (DT2R) to (DTmR) with respect to (RPOINT) are sequentially read out, and are added. This processing corresponds to the operation in FIG. 18, wherein the outputs from the intermediate taps of shift register 34*a* are added by adder 34*c*. In step P34, a value obtained by multiplying (EWAVER) with (RDEPTH) is stored in (EWAVER). That is, reverberation effect waveform data is multiplied with reverberation effect depth data to obtain a right-channel reverberation effect output. The same processing as in steps P32 to P34 is performed for the left channel, thereby obtaining a left-channel reverberation effect output. In order to perform an operation equivalent to the operations of adders 44 and 45 for mixing outputs with those from the former-stage effect additional circuit, step P34 can be modified to execute (EWAVER←EWAVER×RDEPTH+WAVER). For the left channel, the corresponding step can be modified to execute (EWAVEL←EWAVEL×RDEPTH+WAVEL). In this manner, a ratio of an original tone to a reverberation tone is determined by (RDEPTH).

As described above, in the third embodiment, stereophonic outputs added with effect tones can be obtained by time-divisional processing within a sampling time.

In an arrangement wherein a conventional 1-input, 2-output effect addition circuit is used to obtain stereophonic two-channel outputs, when the order of a plurality of effect addition operations is to be changed, the effect of another effect addition circuit connected to the output terminal of this addition circuit cannot be added to one output of the 1-input, 2-input effect addition circuit. When the effect of the 1-input, 2-output effect addition circuit is not added, identical signals are output to the two-channel outputs, resulting in monaural outputs, as well as the above-mentioned drawback. However, in the third embodiment, since stereophonic outputs added with effect tones are obtained by the time-divisional processing, the effect addition operations can be easily reordered, and selection of effects to be added can be facilitated.

In the third embodiment, the delay, chorus, and reverberation effects can be added. However, the present invention can be applied to addition of other effect tones, and the order of addition is not limited to that in this embodiment.

The present invention can be applied to an apparatus which adds a stereophonic effect to a monaural input to obtain stereophonic outputs as well as one for adding effect tones in the stereophonic state. Such a modification can be easily achieved by the third embodiment described above.

Fourth Embodiment A fourth embodiment of an effect addition apparatus according to the present invention will be described hereinafter with reference to FIG. 19 and FIGS. 26 to 29. The apparatus in the fourth embodiment is an apparatus for adding a chorus effect to an original musical tone signal.

Detailed Circuit Arrangement

The circuit arrangement of the apparatus for adding the chorus effect will be described below with reference to FIG. 19 and FIGS. 26(*a*and 26(*b*).

The circuit arrangement in the fourth embodiment is the same as that in the third embodiment described above shown in FIG. 19. However, a control operation is different, as will be described later, and the internal arrangements of tone color parameter memories 55 and 56 are also different. The internal arrangement of tone color parameter memories 55 and 56 shown in FIG. 19 will be described below with reference to FIGS. 26(*a*) and 26(*b*).

FIG. 26(*a*) shows the internal arrangement of tone color parameter memory 55 shown in FIG. 19. Time data t0 to tn generating low-frequency waveforms (LFO waveforms) are stored at addresses "0" to "n"; angle data R0 to Rn for generating the LFO waveforms, addresses "n+1" to "2n"; and change amount data D0 to Dn for generating the LFO waveforms, addresses "2n+1" to "3n". An input pointer (CPOINT) indicating an address in the chorus memory is stored at address "3n+1"; data (CERIAA) indicating the size of a storage area of the chorus memory, address "3n+2"; data (CERIAO) indicating the start address of the memory area of the chorus memory, address "3n+3"; right-channel amplitude data (WAVER) of a musical tone, address "3n+4"; left-channel amplitude data (WAVEL) of a musical tone, address "3n+5"; right-channel amplitude data (EWAVER) of an effect tone, address "3n+6"; and left-channel amplitude data (EWAVEL) of an effect tone, address "3n+7".

Angle data Rn, time data tn, and change amount data Dn associated with the LFO waveform will be explained below. The LFO waveform is divided into points of an amplitude difference "1", an inclination between two adjacent points is represented by clock count rn, clock count rn is stored as angle data Rn, number tn of repetition times of an identical inclination is stored as time data tn, "1" is stored as change amount data Dn when the inclination of the waveform is positive with respect to the amplitude difference "1", and "−1" is stored as change amount data Dn when the inclination of the waverform is negative with respect to the amplitude difference "1". Therefore, from the above-mentioned data, waveform data at respective points of the amplitude difference "1", i.e., integral parts LFOH of the LFO waveform, and waveform data between the integral parts, i.e., integral part LFOH+-decimal part LFOL, can be obtained from a small amount of data.

FIG. 26(*b*) shows the internal arrangement of tone color parameter memory 56. A parameter (T) for changing time is stored at address "0", and a parameter (R) for changing an angle is stored at address "1". Address "2" is used as a counter (C1) for counting angle data; address "3", a counter (C2) for counting time data; address "4", a counter (C3) indicating addresses of angle data, time data, and change amount data; and address "5", a register (REG) for storing an accumulation value of a change amount. Data (OFF1) corresponding to start address "0" of time data of the LFO waveform is stored at address "6"; data (OFF2) corresponding to start address "n+1" of angle data, address "7"; data (OFF3) corresponding to start address "2n+1" of change amount data of the waveform, address "8"; data (CA) corresponding to upper limit n of the storage address of each data of the LFO waverform, address "9"; data (LFOH) corresponding to an integral part of the LFO waveform, address "10"; data (LFOL) corresponding to a decimal part of the LFO waveform, address "11"; data (CDTIME) corresponding to a chorus effect delay time, address "12"; and data (CDEPTH) corresponding to a chorus effect depth, address "13".

Detailed Circuit Operation

The operation of the apparatus for adding the chorus effect with the arrangement as shown in FIG. 19 and FIGS. 26(*a*) and 26(*b*) will be described with reference to FIGS. 27 to 29.

Figure 27:
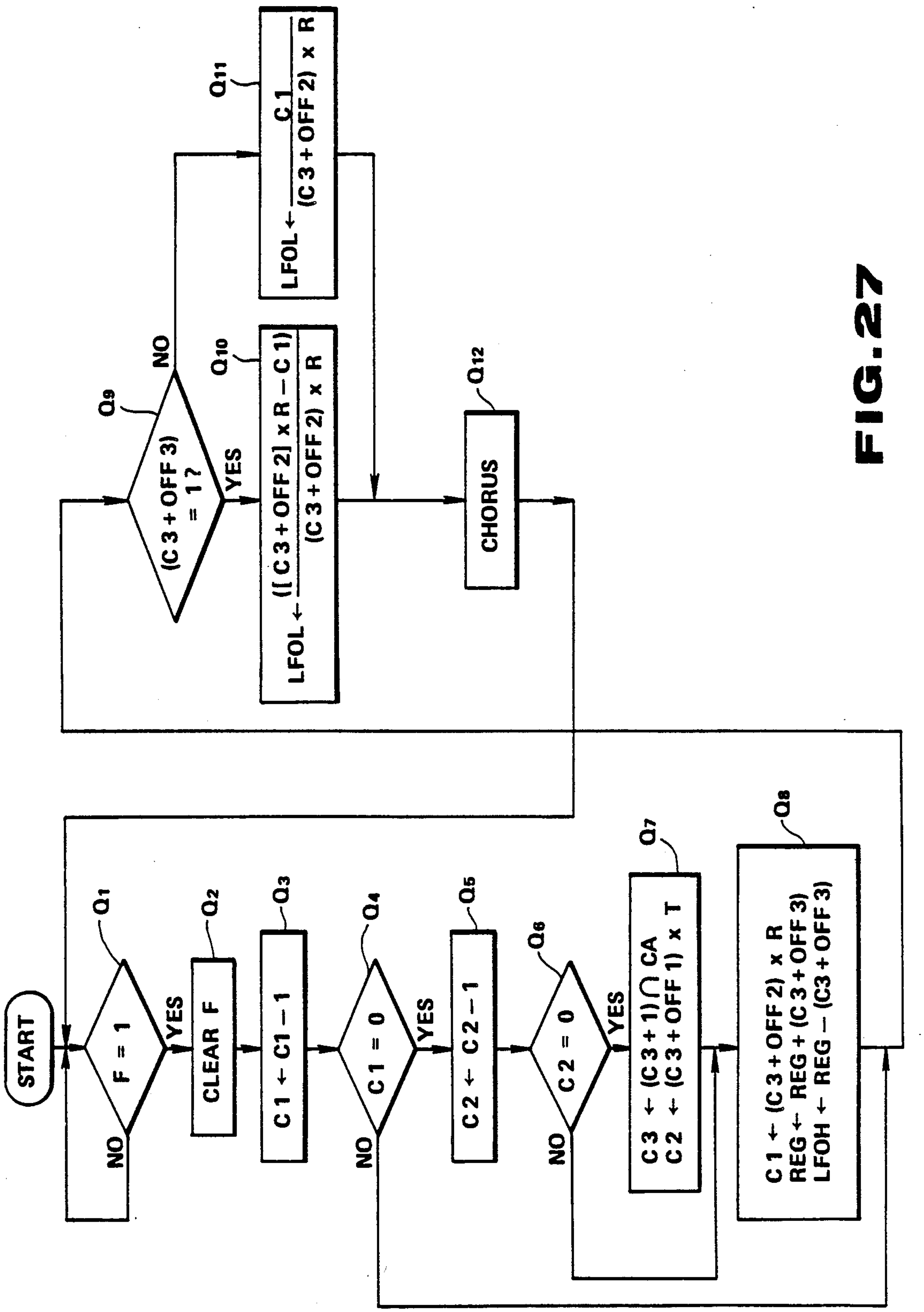
FIG. 27 is a flow chart showing a processing operation of an effect addition apparatus according to the fourth embodiment.
Figure 28:
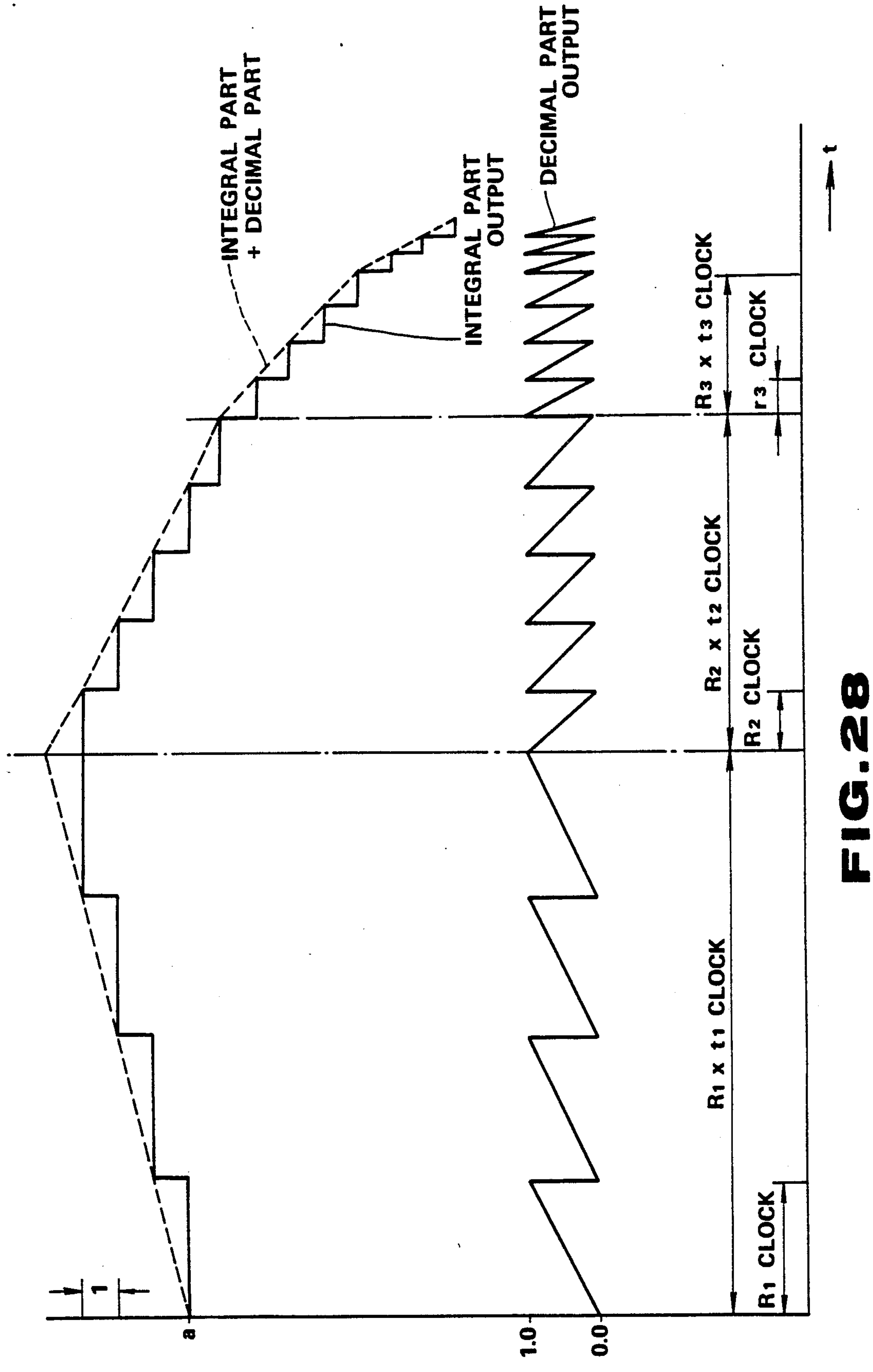
FIG. 28 is a view showing an output waveform of a low-frequency oscillator.

FIG. 27 is a flow chart showing arithmetic operations of the integral and decimal parts (LFOH and LFOL) for generating and outputting low-frequency waveform data, and the processing operation for adding the chorus effect. It is checked if output F from flip-flop 54 is "1" (step Q1). More specifically, flip-flop 54 is set to be "1" in response to the leading edge of external sampling clock CK1, and its output signal F is output to controller 53. Thus, a count start signal is output from controller 53 to program counter 52. Program counter 52 starts counting in synchronism with clock signal CK2, and supplies an address to program memory 51. Controller 53 starts processing based on the content of program memory 51. Controller 53 resets flip-flop 54 to set signal F to be "0", thus allowing input of next external sampling clock CK1 (step Q2). In step Q3, counter C1 is decremented (C1←C1−1), and it is checked in step Q4 if C1="0". If NO in step Q4, control enters processing of obtaining decimal part LFOL of the LFO waveform, as will be described later. If YES in step Q4, the flow advances to step Q5. In the processing in step Q5, time data counter C2 is decremented (C2←C2−1). It is then checked in step Q6 if C2="0".

If YES in step Q6, i.e., if angle data counter C1 and time data counter C2 are "0", this means completion of processing of angle data and time data corresponding to the present LFO waveform data. The upper limit value (CA) of C3 and a value obtained by incrementing counter C3 indicating an address of the LFO waveform data in tone color parameter memory 56 are ANDed, and the AND result is stored as new C3 (C3←(C3+1) ∩ CA). Time data tn indicated by an address corresponding to a sum of the C3 value and the start address (OFF1) of time data is read out, and readout time data tn is multiplied with the parameter (T) for changeing time. The product is then stored in counter C2 (step Q7). Note that in step Q7, ANDing of address (C3+1) and CA is to execute an incrementing operation of C3 within the range not exceeding the upper limit value (CA). When the upper limit value is exceeded, control is made so that an address is returned to the start address.

If (C2=0) is not established in step Q6, or when the next address of the LFO waveform data is indicated by the counter (C3) in step Q7, step Q8 is excuted. That is, angle data Rn indicated by an address corresponding to a sum of the content of the counter (C3) and the start address (OFF2) of the angle data is read out, and the readout angle data (Rn) is multiplied with the parameter (R) for changeing the angle. Then, the product is stored in the angle data counter (C1). Change amount data Dn indicated by an address corresponding to a sum of the content of the counter (C3) and the start address (OFF3) of the change amount data is read out, and the readout data is added to the content of the register (REG) for storing the accumulation value of a change amount. The sum is then stored in the register (REG) (REG←REG+[C3+OFF3]). Change amount data Dn at the present address (C3+OFF3) is substracted from the accumulation value (REG) of the change amount data, and the difference is stored in a memory as the integral part (LFOH) of the LFO waveform data (LFOH←REG−[C3+OFF3). Note that the change amount data at the present address is subtracted from the accumulation value (REG) of the change amount data because the accumulation value (REG) before change amount data at the present address is added corresponds to the integral part (LFOH) of the LFO waveform data at that address.

If NO in step Q4, or as the next processing of step Q8, it is checked if the change amount data in the memory location indicated by the address (C3+OFF3) is "1" (step Q9). Then, processing of calculating a decimal part of the LFO waveform in accordance with the value of the change amount data is executed. If the change amount data is "1" (inclination of the waveform is positive), a value ([C3+OFF2]×R−C1) obtained by subtracting the value of angle data counter C1 from a value obtained by multiplying R with angle data Rn indicated by an address corresponding to a sum of C3 and the start address (OFF2) of the angle data is divided by the output value ([C3+OFF2]×R) of the angle data, and the quotient is stored as the decimal part (LFOL) of the the quotient is stored as the decimal part (LFOL) of the LFO waveform (step Q10).

If the change amount data is "−1" (the inclination of the waveform is negative), the value of angle data counter C1 is divided by the output value of the angle data ([C3+OFF2]×R), and the quotient is stored as the decimal part (LFOL) of the LFO waveform (step Q11).

The integral part (LFOH) and decimal part (LFOL) of the LFO waveform obtained by the above-mentioned processing (Q1 to Q11) will be described below in detail with reference to the waveform chart in FIG. 28.

As described above, in the area (addresses "0" to "3n") for storing the LFO waveform data of tone color parameter memory 55, when the LFO waveform is divided into points of an amplitude difference "1", an inclination of the waveform between adjacent points of the amplitude difference "1" is represented by clock count rn therebetween, clock count rn is stored as angle data Rn, a section that can be approximated by an identical inclination is represented by number tn of continuous times, number tn is stored as time data tn, "1" is stored as change amount data D when the inclination of the waveform is positive with respect to the amplitude difference "1", and "−1" is stored as change amount data D when the inclination is negative with respect to the amplitude difference "1". The waveform corresponds to the sections having the same inclination can be represented by a set of angle data Rn, time data tn, and change amount data D.

The integral part (LFOH) of the waveform, i.e., points of the amplitude difference "1" can be calculated from the accumulation value (REG) of change amount data D. The decimal part (LFOL) of the waveform, i.e., waveform data between adjacent points of the amplitude difference "1" can be calculated from angle data Rn.

Therefore, processing of calculating the integral and decimal parts of the LFO waveform is executed by the steps mentioned above. When the values of the angle data counter (C1) and the time data counter (C2) simultaneously become "1" at a given time, data at the next address, e.g., (R1, t1, 1) are read out, and are set in the corresponding counters and register. In this case, since the change amount data is "1", the angle data counter (C1) is sequentially decremented, and the decimal part output is increased stepwise from "0" to "1" while clock CK is counted R1 times, as shown in FIG. 28. Each time the angle data counter (C1) reaches "0", the time data counter (C2) is decremented, the integral part output is incremented by "1" for every R1 clocks CK, and this incrementation is continued t1 times. In this manner, after R1× t1 clocks CK are counted, data (R2, t2, −1) at the next address are read out, and are set in the corresponding counters and register. In this case, since change amount data is "−1", the integral part output is decremented by "1" for every R2 clocks CK, as shown in FIG. 28, and this decrementation is continued t2 times. While R2 clocks are counted, the decimal part output is decremented stepwise from "1" to "0". Similarly, the integral and decimal part outputs are calculated, and these values are added to produce and output the LFO waveform indicated by the dotted line in FIG. 28.

A chorus effect for adding a frequency-modulated delayed output to an original musical tone based on the LFO waveform obtained as described above, will be described below.

Figure 29:
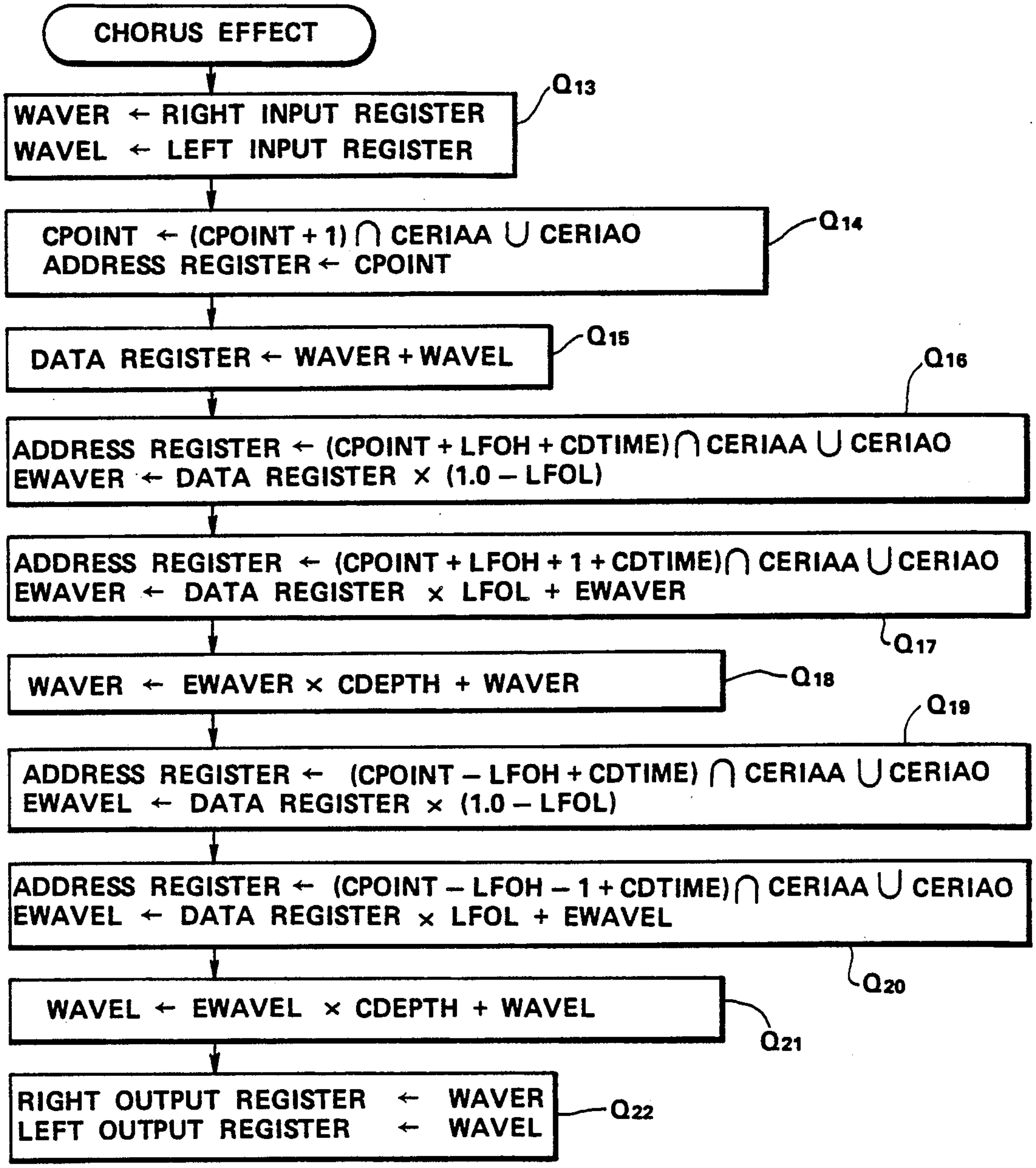
FIG. 29 is a flow chart showing a chorus effect addition processing operation.

FIG. 29 is a flow chart for explaining in detail processing of adding the chorus effect (corresponding to step Q12 in FIG. 27). Amplitude data of input musical tone signals output from right and left input registers 66 and 67 are respectively stored in registers (WAVER) and (WAVEL) (step Q13). A pointer (CPOINT) indicating an address of the chorus memory is incremented, and the incremented value and (CERIAA) indicating the size of the area of the chorus memory are ANDed. The AND result and the start address (CERIAO) of the chorus memory are ORed, and the OR result is stored as new (CPOINT) (CPOINTT)←(CPOINT+1)∩ CERIAA∪ CERIAO). The value (CPOINT) is also stored in the address register (step Q14). More specifically, when an address indicated by the incremented value of (CPOINT) is present in the memory area of the chorus memory, the incremented value become the content of (CPOINT). When the incremented value exceeds the end addressed of the the memory area, the start address (CERIAO) of the memory area of the chorus memory becomes the content of (CPOINT). Then, (WAVER) and (WAVEL) are respectively transferred to data register 65. Right- and left-channel amplitude data are sequentially written at addresses of waveform data memory 63 indicated by address register 64 (step Q15). Thus, the amplitude data of the input musical tone signals are sequentially written in waveform data memory 63 as time elapses.

(CERIAA) and a sum of (CPOINT), the integral part (LFOH) of the LFO waveform, and the delay time (CDTIME) are ANDed, and a value obtained by ORing the AND result and the (CERIAO) is stored in address register 64 (address register←(CPOINT+-LFOH+CDTIME)∩ CERIAA∪ CERIAO). Amplitude data read out from waveform data memory 63 by the addressing and stored in data register 65 is multiplied with a value obtained by subtracting the decimal part (LFOL) from "1.0", and the product is stored in (EWAVER) (EWAVER← data register×(1.0−-LFOL) (step Q16). The value of address register 64 is incremented by "1" (address register← (CPOINT+-LFOH+1+CDTIME)∩CERIAA∪ CERIAO). Amplitude data at the next address (the value in data register 65) in multiplied with the decimal part (LFOL), the product is added to (EWAVER), and the sum is stored in (EWAVER) (EWAVER← data register×LFOL-+EWAVER) (step Q17).

More specifically, when addressing is performed using an address corresponding to a sum of (CPOINT), (LFOH), and (CDTIME) and an address corresponding to a sum of this address and "1", amplitude data of the musical tone signals stored in waveform data memory 63 corresponding to previous timings (LFOH+C-DTIME) and (LFOH+CDTIME+1) past the present time can be read out, and these values are linearly interpolated to a value corresponding to the decimal part (LFOL), thus obtaining amplitude data between two adjacent addresses having a difference of "1".

In this manner, the contents of waveform data memory 63 at previous addresses past the present write address by the integral part (LFOH) of the LFO waveform are read out, thus sequentially obtaining amplitude data of the previous musical tone signals. An interpolated value of amplitude data of musical tone signals between addresses designated by integral parts (LFOH) can be obtained by a simple interpolation using the integral and decimal parts (LFOH and LFOL). Therefore, a conventional arithmetic operation wherein addresses of points to be interpolated are calculated from an interval between addresses corresponding to a delay time, and amplitude data is calculated from amplitude data at the obtained two points, need not be performed, and arithmetic processing can be simplified.

Since frequencies and amplitudes of the LFO waveform data read out from the memory can be varied by simple digital arithmetic processing, various modulation characteristics and reverberation characteristics can be provided.

Next, (EWAVER) obtained in steps Q16 and Q17 is multiplied with the depth (CDEPTH) of the chorus effect, and the product is added to (WAVER). The sum is newly stored in (WAVER) (step Q18). Thus, amplitude data (EWAVER) having a delay time corresponding to (LFOH+CDTIME) is amplitude-modulated by the depth (CDEPTH) of the chorus effect to be obtained as a right-channel chorus effect. The chorus effect is added to the original right-channel musical tone, and the obtained signal is output as a right-channel musical tone (WAVER).

In order to add the chorus effect to the right-channel musical tone, amplitude data at an address corresponding to a sum of (CPOINT), (CDTIME), and (−LFOH) and at an address obtained by subtracting "1" from this address are read out in the same manner as in steps Q16 and Q17, and these amplitude data are interpolated to a valve corresponding to the decimal part (LFOL) (steps Q19 and Q20). More specifically, in steps Q19 and Q20, addressing is performed using a value obtained by inverting the LFO waveform used for obtaining the right-channel chorus effect, and the interpolation arithmetic operation is performed in the same manner as described above.

A value obtained by multiplying the left-channel chorus waveform (EWAVEL) with (CDEPTH) is added to the original left-channel musical tone (WAVEL), and the sum is stored in (WAVEL) (step Q21). The right- and left-channel amplitude data obtained in this manner are transferred to right and left output registers 68 and 69, thereby outputting musical tones added with the chorus effect.

The above-mentioned processing (Q13 to Q22) is sequentially executed for right- and left-channel amplitude data at respective sampling points, so that stereophonic chorus effects can be added to original musical tone signals by time-divisional processing.

Previous amplitude data past the write address of amplitude data of the input musical tone signal by an address corresponding to the LFO waveform data is read out, so that a delay time and a period for which the delay time changes can be obtained based on the frequency and amplitude of the LFO waveform. Thus, the delayed outputs frequency-modulated by the LFO waveform can be obtained as effect tones.

The LFO waveform data is constituted by the integral and decimal parts (LFOH and LFOL). The read address of the amplitude data is controlled in correspondance with the integral part (LFOH), and amplitude data read out by the addressing are interpolated by the decimal part (LFOL), so that amplitude data between, e.g., adjacent addresses can be obtained. When a modulation effect in which a delay time changes as time elapses, fine amplitude data can be obtained, and natural reverberation tones can be obtained.

For delay effects added to the right- and left-channel musical tone signals, the LFO waveform output is inverted and supplied to one channel, so that complementary delay characteristics can be provided to the right and left channels. In this case, effect tones of different delay characteristics can be provided to the right and left channels using one LFO waveform.

In the fourth embodiment, the LFO waveform output is inverted to perform addressing of the other channel. However, addressing can be performed while a predetermined offset is provided to read addresses of LFO waveform data, so as to obtain LFO waveform data of the other channel. A previous address past the present address by an address determined by the LFO waveform having different phases for the right and left channels can be designated.

The integral and decimal parts of the LFO waveform are not limited to integral and decimal values of waveform data. Addressing need only be performed using the integral part, and amplitude data interpolation need only be performed using the decimal part.

Addressing using the LFO waveform data and interpolation of amplitude data obtained by the addressing can be amplied not only to the data format consisting of angle data, time data, and change amount data, but also to data of another format. For example, a value corresponding to an integral part of an amplitude is stored in upper bits and a value corresponding to a decimal part is stored in lower bits as low-frequency function waveform data. An address separated from the present address by a change amount is designated by the upper bits so as to read out amplitude data having a delay time corresponding to the low-frequency function waveform, and amplitude data obtained by the addressing are interpolated based on the lower bits, thereby obtaining amplitude data between adjacent addresses.

Fifth Embodiment

A fifth embodiment of an effect addition apparatus according to the present invention will be described hereinafter with reference to FIG. 30 and FIGS. 30 to 36. The apparatus of the fifth embodiment is an apparatus for adding a tremolo effect to an original musical tone signal.

Schematic Description of Operation using Principle Block Diagram

The principle arrangement and operation of the apparatus of the fifth embodiment will be described below with reference to FIGS. 30 to 33.

Figure 30:
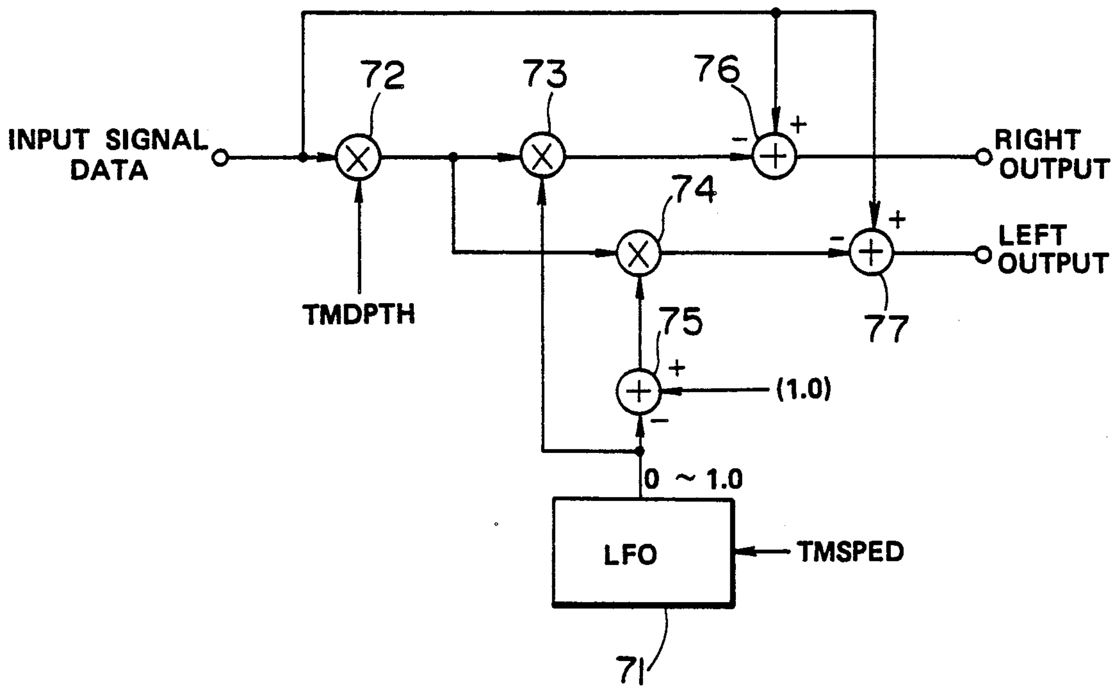
FIG. 30 is a block diagram showing the principle of the fifth embodiment.

FIG. 30 is a principle block diagram showing an apparatus for adding a tremolo effect. This apparatus executes arithmetic processing using low-frequency waveform data (1.0 to 0) output from low-frequency oscillator (LFO) 71 so as to obtain stereophonic outputs added with the tremolo effect. More specifically, input signal data is multiplied with a value (TMDPTH) for determining a depth of the tremolo effect, and the product is supplied to two multipliers 73 and 74. One multiplier 73 multiplies the output from multiplier 72 with the output from LFO 71, and the other multiplier 74 multiplies the output from multiplier 72 with a sum of "1" and a value obtained by inverting the output from LFO 71 by adder 75. The products are respectively supplied to adders 76 and 77. More specifically, one multiplier 73 receives the output from LFO 71, and the other multiplier 74 receives a value obtained by changing a phase of the output from LFO 71 (i.e., inverting the phase), so that the received outputs are multiplied with the output from multiplier 72. Adders 76 and 77 respectively add values obtained by inverting the outputs from multipliers 73 and 74 to input signal data, and output the sums as stereophonic right and left outputs. Note that LFO 71 receives a value (TMSPED) for determining a tremolo speed, and the frequency of a signal generated by LFO 71 is changed based on this value.

Figure 31:
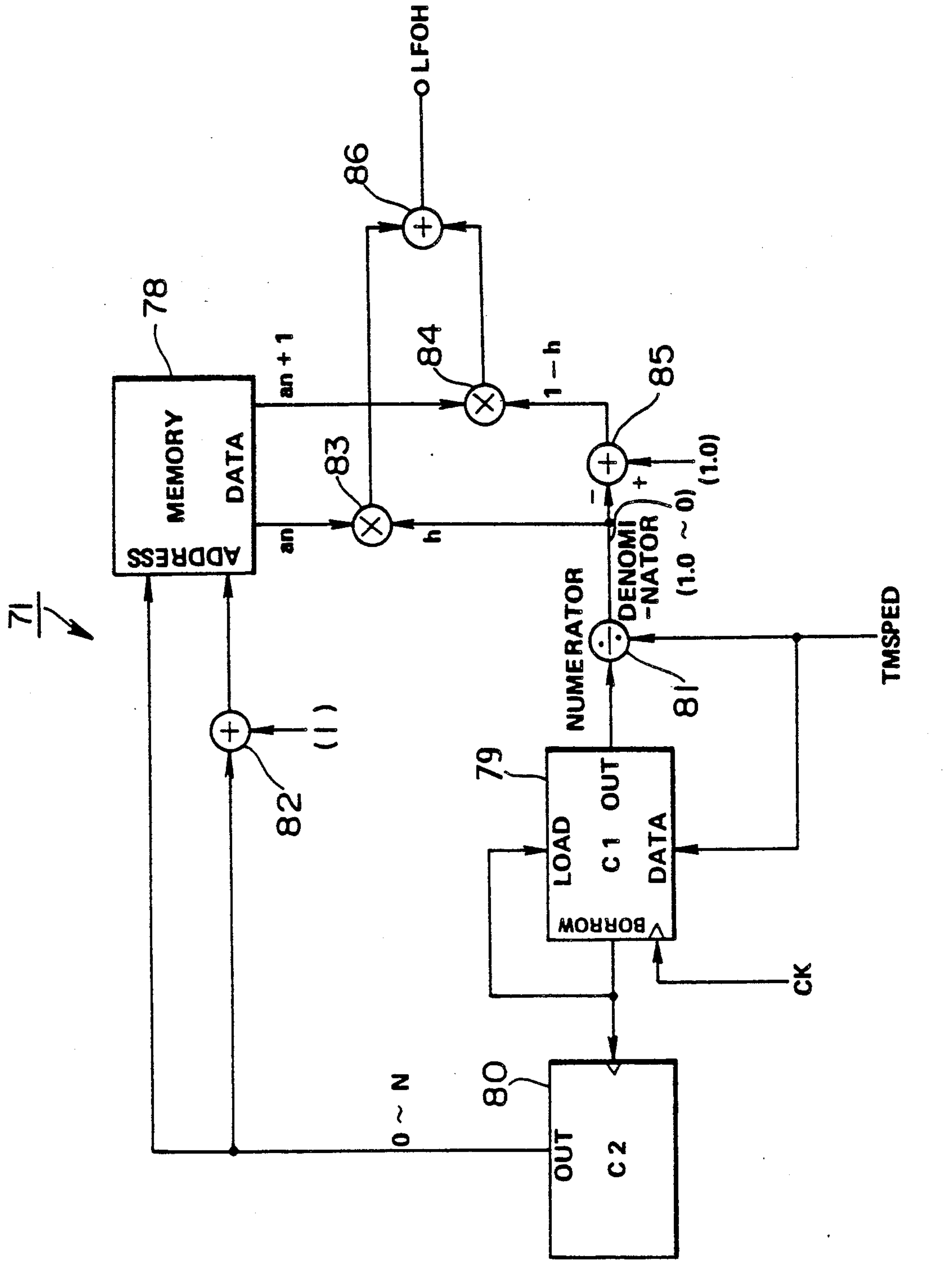
FIG. 31 is a block diagram showing a waveform generator (LFO) shown in FIG. 30.

FIG. 31 is a block diagram showing low-frequency oscillator (LFO) 71 shown in FIG. 30. In FIG. 31, LFO 71 has memory 78 for storing an output waveform, first and second counters 79 and 80, and the like. Memory 78 stores low-frequency modulation waveform data to be generated as a value of 0 to 1.0 for one period in the form of a cosine wave or saw-tooth wave. First counter 79 receives a value (TMSPED) for determining a tremolo speed as load data. First counter 79 receives clock CK from a clock generator (not shown) at its clock terminal, and performs decrementing. When first counter 79 generates a borrow output, it loads the load data (TMSPED). The decrement count output from first counter 79 is supplied to divider 81, and its borrow output is supplied to the clock terminal of second counter 80. Second counter 80 performs incrementing for every borrow output from first counter 79, and outputs read addresses "O" to "N". More specifically, first and second counters 79 and 80 constitute address generating means. Memory 78 receives the read address from second counter 80, and also receives a read address obtained by adding "1" to the read address from second counter 80 by adder 82. Waveform data read out using the read address supplied from second counter 80 to memory 78 is supplied to first multiplier 83, and waveform data read out using the read address supplied from adder 82 to memory 78 is supplied to second multiplier 84. Divider 81 receives data TMSPED, and supplies a quotient obtained by dividing the output from first counter 79 with (TMSPED) to first multiplier 83 and adder 85. Adder 85 adds "1" to a value obtained by inverting the output from divider 81, and supplies the sum to second multiplier 84. The outputs from first and second multipliers 83 and 84 are added by adder 86, and the sum output is output as waveform data (LFOH). That is, divider 81, first and second multipliers 83 and 84, and adders 85 and 86 constitute waveform data interpolation means.

The operation of the apparatus for adding the tremolo effect with the above arrangement will be described below.

Figure 32:
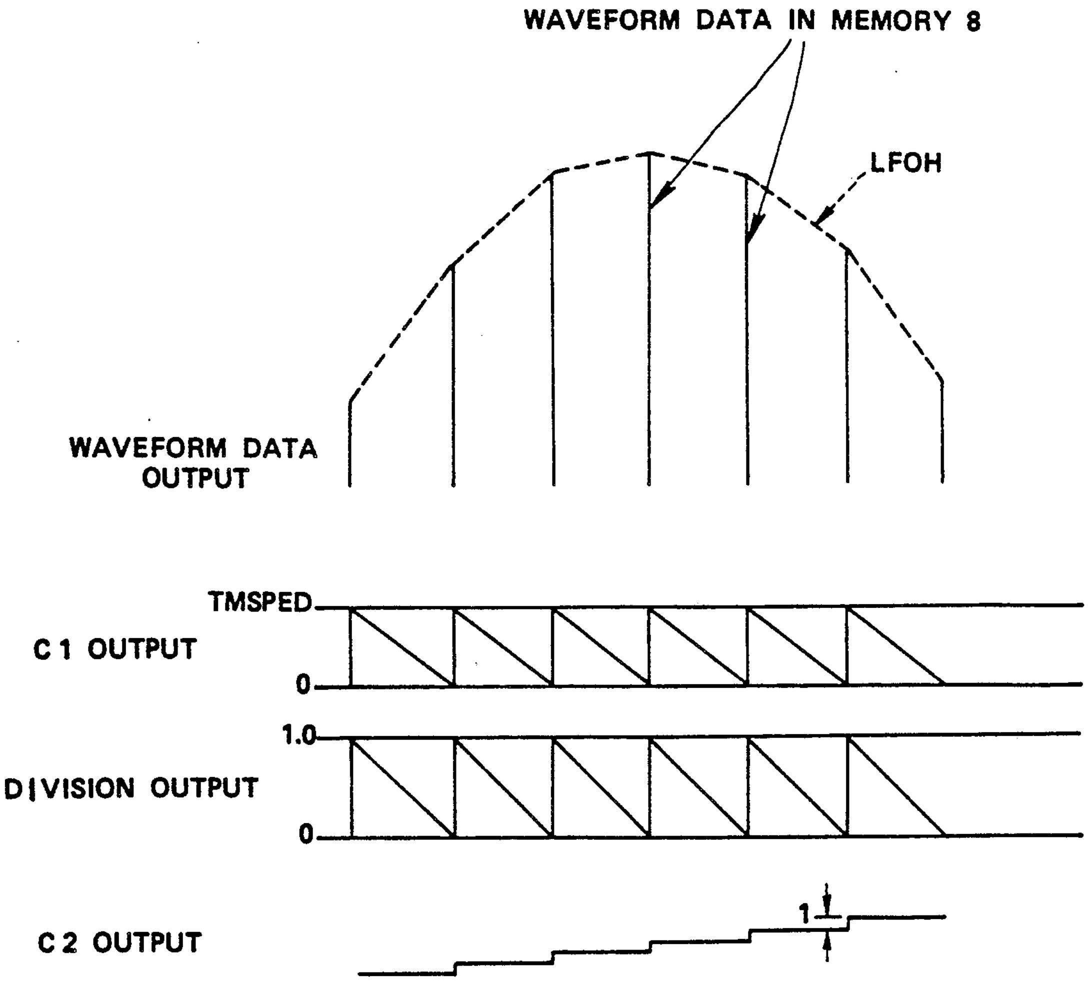
FIG. 32 is a view for explaining a waveform generated by the waveform generator shown in FIG. 31.
Figure 33:
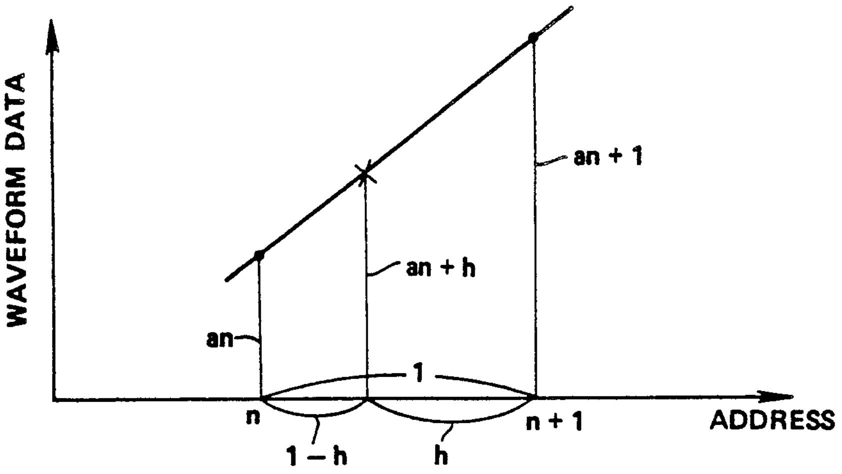
FIG. 33 is a view for explaining interpolation of waveform data generated by the waveform generator shown in FIG. 31.

The operation of LFO 71 shown in FIG. 31 will be described with reference to the waveform chart shown in FIG. 32. When the data (TMSPED) is loaded to first counter 79 at a given time, first counter 79 performs decrementing in response to every clock CK. When a borrow output is generated, the data (TMSPED) is again loaded. Therefore, the output (Cl output) from first counter 79 repetitively forms a waveform wherein the value of (TMSPED) is sequentially decreased to "0" in response to every clocks, as shown in FIG. 32. Since the output (quotient output) from divider 81 is obtained by dividing the output from first counter 79 by (TMSPED), it forms a waveform wherein the value is sequentially decreased from "1" to "0 in response to every clock CK, as shown in FIG. 32. Second counter 80 performs incrementing each time a borrow output is supplied from first counter 79, and its incremented output (C2 output) is increased stepwise by "1", as shown in FIG. 32. The output from adder 82 is obtained by adding "1" to the C2 output. Waveform data read out using the read address supplied from second counter 80 to memory 78 is multiplied with the output from divider 81 by first multiplier 83. Waveform data read out using the read address supplied from adder 82 to memory 78 is multiplied with the output from adder 85 by second multiplier 84. The outputs from first and second multipliers 83 and 84 are added by adder 86. More specifically, as shown in FIG. 33, assuming that the value of waveform data read out using the read address supplied from second counter 80 to memory 78 is given as $a_n$ and waveform data read out using the read address supplied from adder 82 to memory 78 is given as $a_{n+1}$, and the output from divider 81 is given as h, the output from adder 85 is expressed by $(1-h)$. The outputs from first and second multipliers 83 and 84 are respectively expressed by $(h \times a_n)$ and $\{(1-h) \times a_{n+1}\}$, and the output a n+h from adder 86 is given by the following equation:

$$a_{n+h}=h.a_n+(1-h).a_{n+l}$$

$a_{n+h}$corresponds to an arithmetic operation for interpolating waveform data $a_n$ and $a_{n+l}$ read out using addresses n and $_{n+1}$ at a ratio of $l-h$ and h. More specifically, each time the borrow output is generated from first counter 79, waveform data in memory 78 having an address difference of "1" are sequentially interpolated, thus obtaining an (LFOH) output indicated by a dotted line in FIG. 32. The (LFOH) output changes depending on (TMSPED). More specifically, as (TMSPED) is increased, a borrow output interval of first counter 79 is prolonged. When (TMSPED) is decreased, the borrow output interval of first counter 79 is shortened, and the period of the output waveform of (LFOH) is shortened.

The operation of the tremolo effect addition apparatus shown in FIG. 30 will be described below.

Input signal data is multiplied with (TMDPTH) by multiplier 72, thereby determining a tremolo depth. The output from multiplier 72 is supplied to multipliers 73 and 74, and is multiplied with the output from LFO 71 and the output from adder 75 obtained by inverting the output from LFO 71, respectively. The outputs from multipliers 73 and 74 are respectively supplied to adders 76 and 77. The inverted values of adders 76 and 77 are added to the input signal data, thus obtaining stereophonic right and left outputs. More specifically, amplitude modulation is performed in accordance with the output from LFO 71 by multipliers 73 and 74, and the amplitude-modulation outputs are added to the input signal data by adders 76 and 77, thus obtaining tones added with the sterophonic tremolo effect.

Detailed Circuit Arrangement

The detailed circuit arrangement of the apparatus for adding a tremolo effect to an original musical tone signal will be described hereinafter with reference to FIG. 19 and FIGS. 34 to 36. This circuit arrangement realizes the functions corresponding to the principle block diagrams shown in FIGS. 30 and 31. The circuit arrangement in the fifth embodiment is the same as that shown in FIG. 19 in the third embodiment. However, a control operation is different, and internal arrangements of tone color parameter memories 55 and 56 are also different, as will be described later.

The internal arrangements of tone color parameter memories 55 and 56 shown in FIG. 19 will be described below with reference to FIGS. 34(a) and 34(b).

FIG. 34(a) shows the internal arrangement of tone (color parameter memory 55 shown in FIG. 19. LFO) waveform data corresponding to waveform data stored in memory 78 shown in FIG. 31 are stored at addresses "0" to "N", and input signal waveform data (WAVE1 and WAVE2) are stored at addresses "N+1" and "N+2".

FIG. 34(b) shows the internal arrangement of tone color parameter memory 56 shown in FIG. 19. Tremolo effect depth data (TMDTH) is stored at address "0", and data (TMSPED) for determining a tremolo speed is stored at address "1". Addresses "2" and 37 3" are respectively set to be counters (C1 and C2) corresponding to first and second counters 79 and 80 shown in FIG. 31. Data (N) corresponding to the number (upper limit value of C2) of LFO waveform data is stored at address "4"; data (H) corresponding to the content of the quotient from divider 81 shown in FIG. 31, address "5"; and data (LFOH) corresponding to the content of the LFO output as the sum output from adder 86 shown in FIG. 31, address "6".

Detailed Circuit Operation

The operation of the apparatus for adding the tremolo effect with the arrangement as shown in FIG. 19 and FIGS. 34(a) and 34(b) will be described below with reference to FIGS. 35 and 36.

Figure 35:
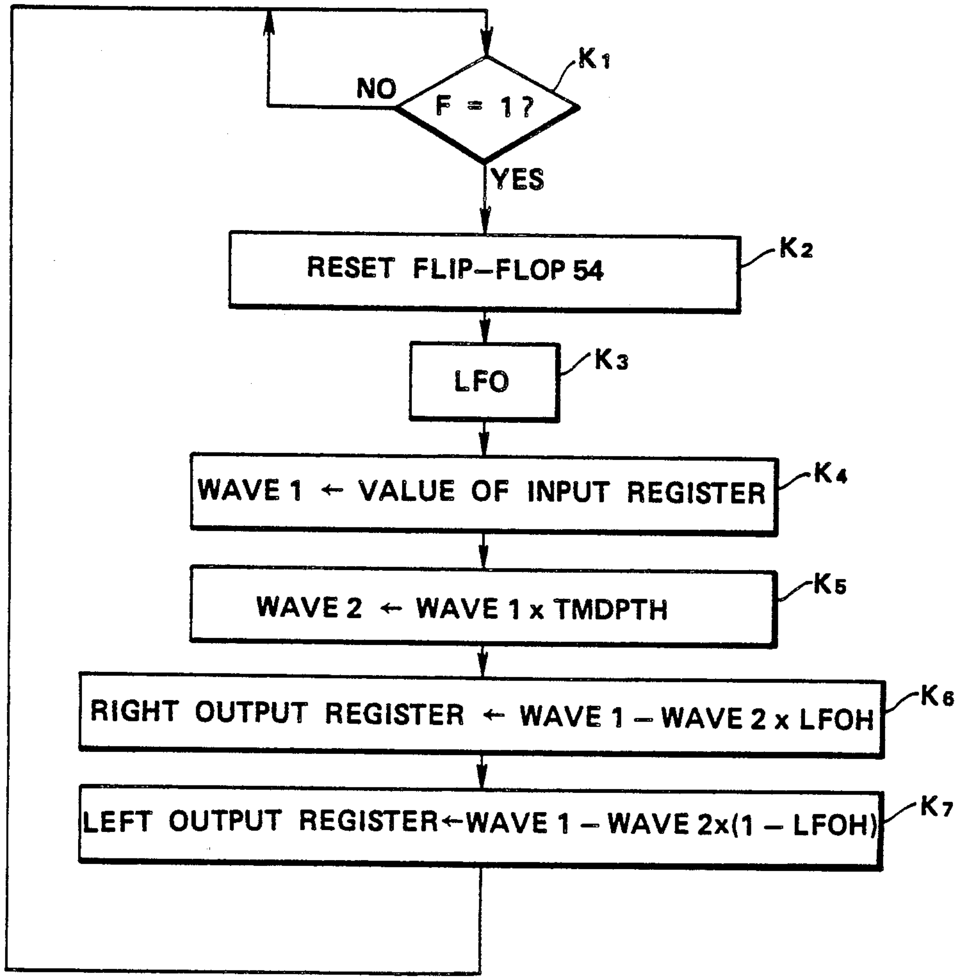
FIG. 35 is a flow chart showing the overall processing operation of an effect addition apparatus of the fifth embodiment.

The flow chart shown in FIG. 35 shows the overall processing operation of the apparatus for adding the tremolo effect. It is checked in step K1 in FIG. 35 if a state (F) of flip-flop 54 is "1". More specifically, if F=1, signal F is supplied to controller 53, and controller 53 supplies a count start signal to program counter 52 in response to signal F. Program counter 52 starts incrementing of a count in synchronism with clock signal CK2, and supplies an address to program memory 51. The content of program memory 51 is supplied to controller 53, thus controlling the respective sections. In step K2, a reset signal is supplied from controller 53 to flip-flop 54, thereby resetting flip-flop 54 (F=0). In step K3, processing (LFO) of generating low-frequency LFO waveform data (to be described later in detail) is executed. In step K4, the value of input register 66 is written in (WAVE1) (WAVE1← value of input register). In step K5, a value obtained by multiplying (WAVE1) with (TMDPTH) is written is (WAVE2) (WAVE2←WAVE1×TMDPTH). Steps K4 and K5 correspond to processing of multiplying input signal data with (TMDPTH) by multiplier 72 in FIG. 30. In step K6, a value obtained by multiplying (WAVE2) with (LFOH) is subtracted from (WAVE1), and the difference is transferred to right output register 68 (right output register←WAVE1−WAVE2×LFOH).

In stepo K7, a value obtained by multiplying (WAVE2) with (1−LFOH) is subtracted from (WAVE1), and the difference is transferred to left output register 69 (left output register ←WAVE1−-WAVE2×(1−LFOH). The processing in step K6 corresponds to the following operations in FIG. 30. That is, the output from multiplier 72 is multiplied with the output from LFO 71 by multiplier 73, and a value obtained by inverting the product is added to the input signal data by adder 76 to output the sum data. The processing in step K7 corresponds to the following operations in FIG. 30. That is, the output from multiplier 72 is multiplied with the inverted value of the output from LFO 71 by multiplier 74, and the inverted value of the product is added to the input signal data by adder 77 to output the sum data. After the processing in step K7, the flow returns to step K1, and the same processing is repeated in response to every sampling clock CK.

Figure 36:
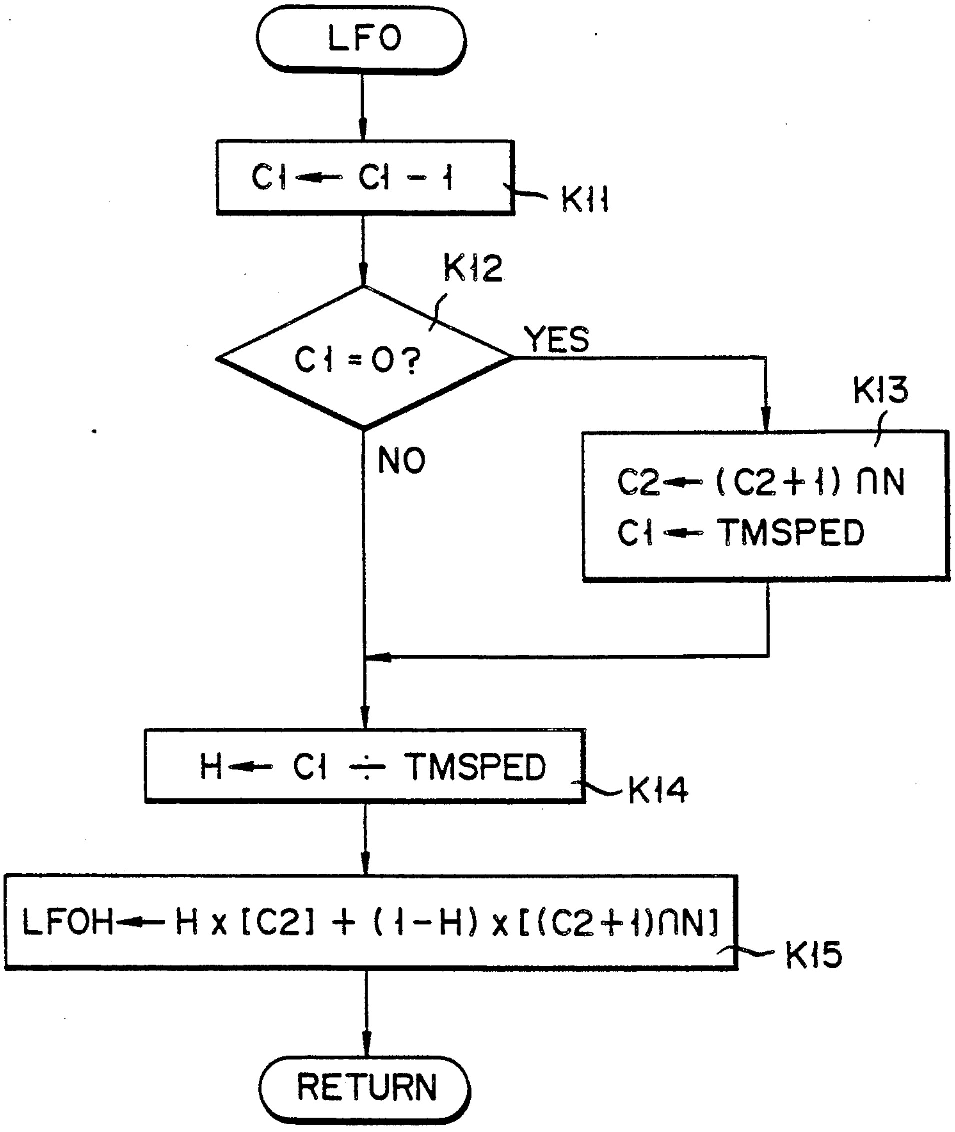
FIG. 36 is a flow chart showing a processing operation of a waveform generator shown in FIG. 35.

The flow chart shown in FIG. 36 shows the processing operation of the LFO. In step K11 in FIG. 36, a value obtained by subtracting "1" from (C1) is stored in (C1 (C1←C1−1). More specifically, this operation coresponds to that in which first counter 79 (FIG. 31) is decremented in response to eachd sampling clock CK. It is checked in step K12 if (C1) is "0". If (c1=0) an AND result of an incremented value of (C2) and (N) is stored in (C2) (C2← (C2+1)∩N. (TMSPED) is stored in (C1) (C1← TMSPED). In the logic arithmetic operation in step K13, when the incremented value of (C2) does not exceed the number of LFO waveform data, the incrmeented value becomes the content of (C2). When the incremented exceeds the value, an initial value d (N=0) becomes the content of (C2). In NO in step K12, or after the processing in step K13, (C1) is divided by ds (TMSPED) in step K14, and the quotient is stored in (H) (H←C1/TMSPED). More specifically, the processing in steps K12, K13, and K14 corresponds to the following operations in FIG. 31. That is, when the value of first counter 79 becomes "0", a borrow output is generated,d second counter 80 is counted up in response to the borrow output, and (TMSPED) is loaded to first counter 79 again. When the value of first counter 79 is notd "0", the output from first counter 79 is divided by (TMSPED) by divideer 81. In step K15, a product of (H) and waveform data at an address indicated by (C2) is added to a product of (1−H) and waveform data indicated by a value obtained by adding "1" to (C2), and the sum is stored in (LFOH) (LFOH←H×[C2]+(1−H)×[C2+1)∩N]. More specifically, the processing in step K15 corresponds to the following operations in FIG. 31. That is, a value read out from memory 78 using the output from second counter 80 as an address and the output from divider 81 are multiplied by first multiplier 83, a value read out from memory 78 using the output from adder 82 as an address is multiplied with the output from adder 85 by second multiplier 84, and the outputs from first and seocnd multipliers 83 and 84 are added by added 86 to obtain (LFOH).

In this manner, according to the fifth embodiment, the low-frequency waveform output obtained at each sampling period and a waveform output obtained by inverting the phase of the former waveform output are multiplied with input signal data by digital arithmetic processing, thus obtaining stereophonic tremolo outputs.

Therefore, since digital arithmetic processing is performed, noise can be eliminated as compared to a case wherein an analog circuit is used, and a natural tremolo effect can be obtained. In order to obtain sterephonic tremolo outputs, the number of hardware elements need not be increased, and an arrangément can be simplified. In addition, there are no problems of durability and aging unlike in an analog circuit.

Note that in the fifth embodiment, the waveform of LFO 71 can be arbitrarily determined, and a waveform of at least one period need only be output. As the d waveform of LFO 71, a cosine wave or a saw-tooth wave is continuously generated.

LFO 71 need only obtain low-frequency waveform data for at least each sampling period. For example, LFO 71 may store a waveform to be generated in the form of time data, angle data, and change amount data, and may obtain the LFOH output by arithmetic processing.

In the fifth embodiment, steophonic tremolo outputs are obtained. However, the present invention can be applied to an apparatus for obtaining a monaural tremolo output.

What is claimed is:

1. An effect addition apparatus, comprising:

effect addition means for receiving samples of input signal data for generating effect signal data from the received input signal data, said effect addition means including storing means for storing at least the input signal data and means for delaying the input signal data by controlling a ready address of a storage content stored in said storing means;

first changing means coupled to said effect addition means for changing a volume of said input signal data input to said effect addition means;

second changing means coupled to said effect addition means for changing a volume of the effect signal data output from said effect addition means;

outputting means coupled to said effect addition means for outputting tone color paratmeter data which is supplied to said effect addition means for generating the effect signal data according to the tone color parameter data;

clearing means coupled to said storing means for clearing the storage content of said storing means; and control means coupled to said effect addition means, to said first changing means, to said second changing means, to said outputting means, and to said clearing means, for controlling, when the tone color parameter data is supplied to said effect addition means from said outputting means, said first changing means and said second changing means to gradually decrease a volume of the input signal data supplied to said effect addition means and a volume of the effect signal data output from said effect addition means, for controlling said clearing means to clear the memory content of said storing means, for controlling said outputting means to supply the tone color paratmeter data tod said effect addition means, and for controlling said first changing means and said second changing means to gradually recover the volumes of the input signal data and the effect signal data outputted from said effect addition means.

2. An apparatus according to claim 1, wherein said effect addition means further comprising adder means for feeding back the storage content of said storing means to obtain feedback data and for adding the feedback data and the input data to obtain an addition data which is supplied to said storing means so that reverberation signal data is generated and outputted.

3. The apparatus of claim 1, wherein:

said effect addition means further comprises adder means for feeding back the storage content odf said storing means to obtain feedback data and for adding the feedback data and the input data to obtain an addition data which is supplied to said storing means so that reverberation signal data is generated and outputted and ;

said outputting means including means for outputtingd data for determining a delay time of said delay means and a volume of the feedback data as the tone color parameter data.

4. The apparatus of claim 1, wherein said control means includes means for executing, in a time division manner, a first control operation for generating an effect signal data from the input signal data and a second control operation for supplying the tone color parameter data to said effect addition means from said outputting means, every time one of samples of the input signal data is supplied to said effect addition means.

5. A control method for changing a content of a tone color parameter data to be supplied to an effect addition means which is provided to receive samples of input signal data for generating and outputting effect signal data according to the input signal data, said effect addition means including storing means for storing at least the input signal data and means for delaying the input signal data by controlling a ready address of the storing means to read out a storage content of the storing means so that effect signal data is generated from the effect addition means in accordance with tone color parameter data, said method comprising:

gradually decreasing the volume of the input signald data inputted to said effect addition means by controlling a first changing means for changing the volume of the input signal data input to said effect addition means and for gradually decreasing the volume of the effect signal data outputted from said effect addition means by controlling a second changing means for changing the volume of the effect signal data outputted from said effect addition means;

clearing the storage content of said storing means; supplying tone color parameter data to said effect addition means; and gradually recovering the volume of the input signal data input to said effect addition means and the volume of the effect signal data outputted from said effect addition means by controlling said first changing means and said second changing means.

6. An effect addition apparatus comprising:

effect addition means for receiving samples of input signal data and for generating and outputting effect signal data in accordance with the input signal data;

means coupled to said effect addition means for outputting tone color parameter data which is supplied to said effect addition means for generating the effect signal data in accordance with the tone color parameter data, said outputting means including menas for calculating interpolating data for interpolating between an unchanged tone color parameter and an objective tone color parameter so as to generate gradually changing tone color parameter data, and said outputting means outputting the interpolating data as a net tone color parameterd when the unchanged tone color parameter is changed into the objective tone color parameter; and control means, coupled to said effect addition means and to said outputting means, for performing, when the unchanged tone color parameter is changed to the objective tone color parameter, the following operations during one sample period of the input signal data in a time division manner;

(a) a first control operation for controlling said outputting means for calculating the interpolating data and for supplying the calculated interpolating data to said effect addition means as a new tone color parameter; and (b) a second control operation for controlling said effect addition menas to generate and output the effect signal data according to the input signal data based on the supplied new tone color parameter data.

7. An effect addition apparatus comprising:

input signal data storing means for storing samples of input signal data; 'memory means for storing data for generatingd low-frequency waveform data; and ds control means, coupled to said input signal data storing means and to said memory means, for performing the following operations during one sample period of the input signal data in a time division manner;

(a) a first control operation for controlling said input signal data storing means to store one sample of the input signal data;

(b) a second control operation for calculating low-frequency waveform data according to the data stored in said memory means; and (c) a third control operation for determining a read address of said input signal data storing means based on the low-frequency waveform data to read out delayed input signal data from said input signal storing menas so as to generate effect signal data.

8. The apparatus of claim 7, wherein said memory means include menas for storing angle data, time data nd change amount data, the angle data representing a period of time between two points on a low-frequency waveform which is divided with a predetermined amplitude difference between the points, the change amount data representing whether an inclination of the waveform is positive or negative, and the time data representing the number of times at which the change amount data and the angle data represent the same value, repeatedly.

9. The apparatus of claim 7, wherein said control means perform the following operations during one sample period of the input signal data in a time division manner;d (a) a first control operation for controlling said input signal data storing means to strore therein the one sample of the input signal data;

(b) a second control operation for calculating two low-frequency waveform data of different phases in accordance with the data stored in said memory means; and (c) a third control operation for determining a readd address of said input signal data storing means based on the two low-frequency waveform data to read out therefrom delayed two input signal data so as to generate two effect signal data.

10. An effect addition apparatus comprising:d input signal data storing menas for storing samples of input signal data;d memory means for storing data used to generate low-frequency waveform data; and control means, coupled to said input signal data storing means and to said memory means, for performing the following operations during one sample period of the input signal data in a time division manner;d (a) a first control operation for controlling said input signal data storing mens to store one sample on the input signal data;

(b) a second control operation for calculating low-frequency waveform data in accordance with the data stored in said memory means; and d (c) a third control operation for multiplying the low-frequency waveform data by samples of input signal data to generate effect signal data.

11. The apparatus of claim 10, wherein said control means perform the following operations during one sample period of the input signal data in a time division manner;

(a) a first control operation for controlling said input signal data storing means to store therein one sample of the input signal data;

(b) a second control operation for calculating two low-frequency waveform data of different phases from each other based on the data stored in said memory means; and d (c) a third control operation for multiplying the two low-frequency waveform data by the samples of input signal datad

* * * * *